(12) United States Patent
Sasaki et al.

(10) Patent No.: US 11,124,869 B2
(45) Date of Patent: Sep. 21, 2021

(54) SUBSTRATE PROCESSING METHOD, SUBSTRATE PROCESSING APPARATUS AND PRE-DRYING PROCESSING LIQUID

(71) Applicant: SCREEN Holdings Co., Ltd., Kyoto (JP)

(72) Inventors: Yuta Sasaki, Kyoto (JP); Masayuki Otsuji, Kyoto (JP); Naozumi Fujiwara, Kyoto (JP); Masahiko Kato, Kyoto (JP); Yu Yamaguchi, Kyoto (JP); Hiroaki Takahashi, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/445,451

(22) Filed: Jun. 19, 2019

(65) Prior Publication Data
US 2019/0390320 A1    Dec. 26, 2019

(30) Foreign Application Priority Data

Jun. 22, 2018  (JP) .............................. JP2018-119092
Mar. 18, 2019  (JP) .............................. JP2019-050214

(51) Int. Cl.
  *C23C 14/24*    (2006.01)
  *C23C 14/12*    (2006.01)

(52) U.S. Cl.
  CPC .............. *C23C 14/24* (2013.01); *C23C 14/12* (2013.01)

(58) Field of Classification Search
  CPC ........... C23C 14/24; C23C 14/12; B08B 3/10; H01L 21/02041
  See application file for complete search history.

(56) References Cited

U.S. PATENT DOCUMENTS

| | | | | |
|---|---|---|---|---|
| 2015/0273535 A1* | 10/2015 | Sato | .................. | H01L 21/67028 134/19 |
| 2016/0035595 A1* | 2/2016 | Sato | .................. | H01L 21/02054 134/4 |
| 2017/0040154 A1* | 2/2017 | Kagawa | ............ | H01L 21/67034 |
| 2017/0345683 A1 | 11/2017 | Sasaki et al. | | |

FOREIGN PATENT DOCUMENTS

| CN | 107481954 A | 12/2017 |
|---|---|---|
| JP | 2012-243869 A | 12/2012 |
| JP | 2013-042093 A | 2/2013 |
| JP | 2015-050414 A | 3/2015 |
| JP | 2015-092619 A | 5/2015 |
| JP | 2016-32063 A | 3/2016 |
| JP | 2017-050575 A | 3/2017 |
| JP | 2017-050576 A | 3/2017 |

* cited by examiner

*Primary Examiner* — Michael P Wieczorek
(74) *Attorney, Agent, or Firm* — Ostrolenk Faber LLP

(57) ABSTRACT

A pre-drying processing liquid containing a sublimable substance that changes to gas without passing through to a liquid and a solvent in which the sublimable substance dissolves is supplied to a front surface of a substrate on which a pattern has been formed. Thereafter, the solvent is evaporated from the pre-drying processing liquid on the front surface of the substrate to thereby form a solidified body containing the sublimable substance on the front surface of the substrate. Thereafter, the solidified body is sublimated and thereby removed from the front surface of the substrate. A value acquired by multiplying a ratio of the thickness of the solidified body to the height of the pattern by 100 is greater than 76 and less than 219.

4 Claims, 19 Drawing Sheets

FIG. 9

| Measurement condition No. | Mixing ratio of camphor and IPA (Volume of IPA / Volume of camphor) | Mass percent concentration of camphor (wt%) | Embedding rate (%) | Collapse rate (%) |
|---|---|---|---|---|
| 1-1 | 240 | 0.52 | 65 | 83.5 |
| 1-2 | 200 | 0.62 | 76 | 83.1 |
| 1-3 | 180 | 0.69 | 83 | 76.2 |
| 1-4 | 160 | 0.78 | 91 | 36.1 |
| 1-5 | 140 | 0.89 | 102 | 8.3 |
| 1-6 | 120 | 1.04 | 117 | 10.2 |
| 1-7 | 110 | 1.13 | 126 | 12.8 |
| 1-8 | 100 | 1.24 | 138 | 17.6 |
| 1-9 | 90 | 1.38 | 151 | 41.2 |
| 1-10 | 80 | 1.55 | 168 | 46.8 |
| 1-11 | 60 | 2.06 | 219 | 87.0 |
| 1-12 | 30 | 4.03 | 418 | 91.7 |
| 1-13 | 15 | 7.76 | 797 | 91.0 |

FIG. 12A
FIG. 12B
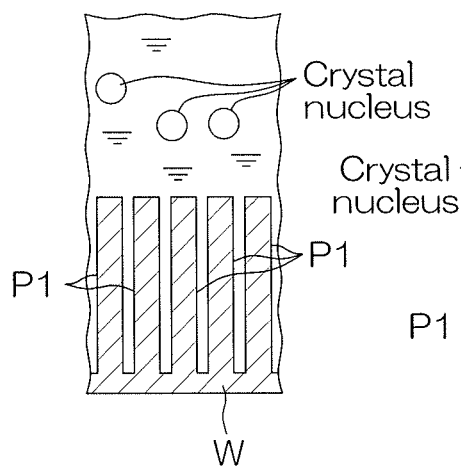
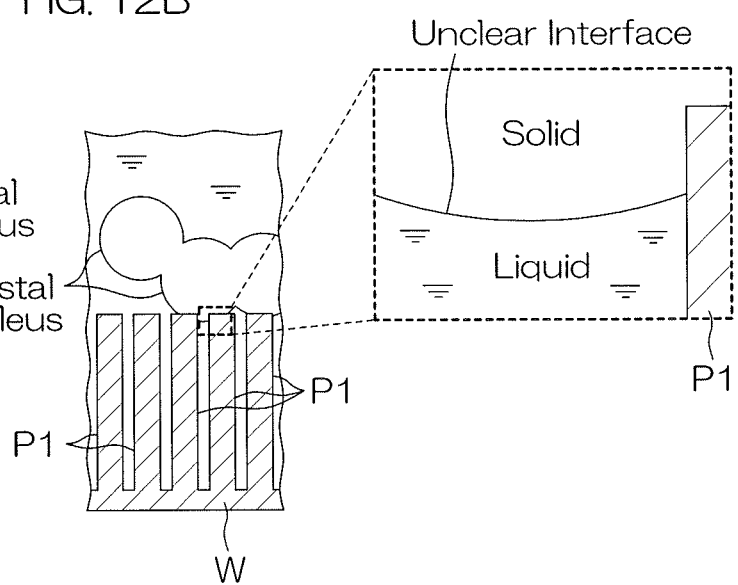
FIG. 13A
FIG. 13B
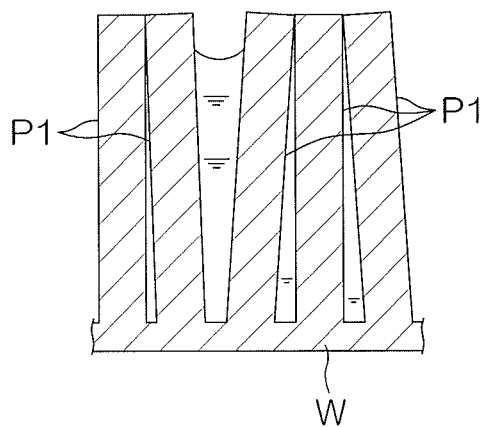
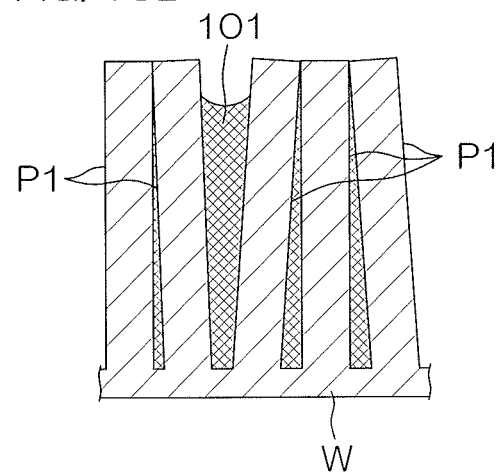

FIG. 14

| Measurement condition No. | Mixing ratio of camphor and IPA (Volume of IPA / Volume of camphor) | Mass percent concentration of camphor (wt%) | Collapse rate (%) |
|---|---|---|---|
| 2-1 | 140 | 0.89 | 91.7 |
| 2-2 | 130 | 0.96 | 58.4 |
| 2-3 | 110 | 1.13 | 37.3 |
| 2-4 | 90 | 1.38 | 50.6 |
| 2-5 | 80 | 1.55 | 95.3 |

FIG. 15

| Measurement condition No. | Mixing ratio of camphor and acetone (Volume of acetone / Volume of camphor) | Mass percent concentration of camphor (wt%) | Collapse rate (%) |
|---|---|---|---|
| 3-1 | 400 | 0.31 | 89.5 |
| 3-2 | 300 | 0.41 | 87.3 |
| 3-3 | 200 | 0.62 | 86.6 |
| 3-4 | 180 | 0.69 | 60.2 |
| 3-5 | 160 | 0.78 | 57.6 |
| 3-6 | 150 | 0.83 | 76.5 |
| 3-7 | 140 | 0.89 | 76.4 |
| 3-8 | 130 | 0.96 | 82.2 |
| 3-9 | 120 | 1.04 | 99.7 |
| 3-10 | 100 | 1.24 | 95.3 |
| 3-11 | 30 | 4.04 | 99.4 |
| 3-12 | 10 | 11.23 | 99.5 |
| 3-13 | 1 | 55.85 | 99.3 |

FIG. 16

| Measurement condition No. | Mixing ratio of camphor and PGEE (Volume of PGEE / Volume of camphor) | Mass percent concentration of camphor (wt%) | Collapse rate (%) |
|---|---|---|---|
| 4-1 | 300 | 0.36 | 99.6 |
| 4-2 | 100 | 1.09 | 99.6 |
| 4-3 | 35 | 3.06 | 98.9 |
| 4-4 | 30 | 3.55 | 88.3 |
| 4-5 | 25 | 4.23 | 79.4 |
| 4-6 | 20 | 5.23 | 57.5 |
| 4-7 | 15 | 6.86 | 62.1 |
| 4-8 | 10 | 9.95 | 99.5 |

SUBSTRATE PROCESSING METHOD, SUBSTRATE PROCESSING APPARATUS AND PRE-DRYING PROCESSING LIQUID

CROSS REFERENCE TO RELATED APPLICATIONS

This application claims the benefit of priority to Japanese Patent Application No. 2018-119092 filed on Jun. 22, 2018 and Japanese Patent Application No. 2019-050214 filed on Mar. 18, 2019. The entire contents of these applications are hereby incorporated herein by reference.

BACKGROUND OF THE INVENTION

1. Field of the Invention

The present invention relates to a substrate processing method and a substrate processing apparatus that process a substrate, and to a pre-drying processing liquid to be supplied to a front surface of a substrate before drying the front surface of the substrate. Examples of substrates to be processed include a semiconductor wafer, a substrate for a flat panel display (FPD) such as a liquid crystal display and an organic electroluminescence (organic EL) display, a substrate for an optical disc, a substrate for a magnetic disk, a substrate for a magneto-optical disc, a substrate for a photomask, a ceramic substrate, a substrate for a solar cell, and the like.

2. Description of Related Art

In a manufacturing process for semiconductor devices or liquid crystal displays, a required process is conducted to substrates such as semiconductor wafers or glass substrates for liquid crystal displays. Such process may include supplying a substrate with a processing liquid such as a chemical liquid or a rinse liquid. After the processing liquid is supplied, the processing liquid is removed from the substrate to dry the substrate. In a single substrate processing-type substrate processing apparatus that processes substrates one by one, a spin dry is conducted to dry the substrate by rotating the substrate at high speeds and removing a liquid adhering to the substrate.

In a case where a pattern is formed on a front surface of the substrate, when the substrate is being dried, a force due to the surface tension of the processing liquid adhering to the substrate applies to the pattern, so that the pattern may collapse. As countermeasures against this, a liquid having a lower surface tension such as IPA (isopropyl alcohol) is supplied to the substrate. Alternatively, a hydrophobizing agent is supplied to the substrate in order to bring the contact angle of the liquid to the pattern closer to 90 degrees. However, a collapsing force to collapse the pattern does not decrease to zero even when using IPA or the hydrophobizing agent. Thus, these countermeasures may not sufficiently prevent the collapse of the pattern depending on the strength of the pattern.

Recently, attention is focused on sublimation drying as a technique to prevent the collapse of the pattern. For example, JP 2012-243869 A discloses a substrate processing method and a substrate processing apparatus for sublimation drying. According to the sublimation drying disclosed in JP 2012-243869 A, a solution of a sublimable substance is supplied to the upper surface of a substrate, so that the DIW on the substrate is replaced with the solution of the sublimable substance. Thereafter, the solvent for the sublimable substance is dried to precipitate the sublimable substance. This forms a film consisting of the solid sublimable substance on the upper surface of the substrate. JP 2012-243869 A discloses in paragraph 0028 that "the thickness "t" of the film consisting of the sublimable substance is preferably as thin as possible to the extent that a convex portion 101 of the pattern is sufficiently covered." After the film consisting of the solid sublimable substance is formed, the substrate is heated. This causes the sublimable substance on the substrate to be sublimated and thus removed from the substrate.

SUMMARY OF THE INVENTION

In general, the sublimation drying provides lower pattern collapse rates as compared with conventional drying methods such as the spin dry to remove a liquid by rotating the substrate at high speeds or the IPA drying that employs IPA. However, if the pattern is extremely low in strength, even when the sublimation drying is performed, the pattern collapse may not sufficiently be prevented in some cases. According to the studies by the present inventors, it was found that one of the causes results from the thickness of a solidified body containing the sublimable substance. In JP 2012-243869 A, described is only "the thickness "t" of the film consisting of the sublimable substance is preferably as thin as possible to the extent that a convex portion 101 of the pattern is sufficiently covered" and the thickness of the sublimable substance film is not sufficiently considered.

One object of the present invention is to provide a substrate processing method, a substrate processing apparatus, and a pre-drying processing liquid each of which is able to reduce collapse of patterns that may occur when the substrate is dried by sublimation drying.

A preferred embodiment of the present invention provides a substrate processing method which includes the following steps, a pre-drying processing liquid supplying step of supplying a front surface of a substrate, on which a pattern has been formed, with a pre-drying processing liquid containing a sublimable substance that changes to gas without passing through to a liquid and a solvent in which the sublimable substance dissolves, a solidified body forming step of forming a solidified body containing the sublimable substance on the front surface of the substrate by evaporating the solvent from the pre-drying processing liquid on the front surface of the substrate, and a sublimating step of removing the solidified body from the front surface of the substrate by sublimating the solidified body. A value acquired by multiplying a ratio of a thickness of the solidified body to a height of the pattern by 100 is greater than 76 and less than 219.

According to the method, the pre-drying processing liquid that contains the sublimable substance corresponding to a solute and the solvent is supplied to the front surface of the substrate on which a pattern has been formed. Thereafter, the solvent is evaporated from the pre-drying processing liquid. This allows a solidified body containing the sublimable substance to be formed on the front surface of the substrate. Thereafter, the solidified body on the substrate is changed to gas without passing through to a liquid. This results in the solidified body being removed from the front surface of the substrate. Therefore, as compared with a conventional drying method such as the spin dry, the pattern collapse rate can be lowered.

When the solvent is evaporated from the pre-drying processing liquid, the solidified body containing the sublimable substance is formed on the front surface of the substrate. Defining a value acquired by multiplying a ratio of the thickness of the solidified body to the height of the pattern by 100 as an embedding rate, the embedding rate at the time of the solidified body being formed is greater than 76 and less than 219. If the embedding rate is out of the range, the number of collapsed patterns increases depending on the strength of the pattern. Conversely, if the embedding rate is within the range, the number of collapsed patterns can be reduced even if the strength of the pattern is low. Therefore, even if the strength of the pattern is low, the pattern collapse rate can be lowered.

In the preferred embodiment, at least one of the following features may be added to the substrate processing method.

The sublimable substance contains at least one of camphor and naphthalene.

The solvent contains at least one of IPA (isopropyl alcohol), acetone, and PGEE (propylene glycol monoethyl ether).

The solvent is IPA, and the mass percent concentration of the sublimable substance in the pre-drying processing liquid is greater than 0.62 and less than 2.06.

The solvent is acetone, and the mass percent concentration of the sublimable substance in the pre-drying processing liquid is greater than 0.62 and 0.96 or less.

The solvent is PGEE, and the mass percent concentration of the sublimable substance in the pre-drying processing liquid is greater than 3.55 and 6.86 or less.

The pre-drying processing liquid supplied to the front surface of the substrate in the pre-drying processing liquid supplying step is a solution that contains the following, the sublimable substance containing a hydrophobic group, the solvent, and an adsorbent substance that contains a hydrophobic group and a hydrophilic group and is higher in hydrophilicity than the sublimable substance.

According to the method, the pre-drying processing liquid that contains the adsorbent substance in addition to the sublimable substance and the solvent is supplied to the front surface of the substrate on which the pattern has been formed. Thereafter, the solvent is evaporated from the pre-drying processing liquid. This allows the solidified body containing the sublimable substance to be formed on the front surface of the substrate. Thereafter, the solidified body on the substrate is changed to gas without passing through to a liquid. This results in the solidified body being removed from the front surface of the substrate. Therefore, the pattern collapse rate can be lowered as compared with a conventional drying method such as the spin dry.

The sublimable substance is a substance that contains the hydrophobic group in the molecule. The adsorbent substance is a substance that contains the hydrophobic group and the hydrophilic group in the molecule. The adsorbent substance is higher in hydrophilicity than the sublimable substance. Even if the surface of the pattern is either hydrophilic or hydrophobic, or alternatively, even if the surface of the pattern includes a hydrophilic portion and a hydrophobic portion, the adsorbent substance in the pre-drying processing liquid is adsorbed to the surface of the pattern.

Specifically, if the surface of the pattern is hydrophilic, the hydrophilic group of the adsorbent substance in the pre-drying processing liquid is adhered to the surface of the pattern, while the hydrophobic group of the sublimable substance in the pre-drying processing liquid is adhered to the hydrophobic group of the adsorbent substance. This allows the sublimable substance to be held on the surface of the pattern through the adsorbent substance. If the surface of the pattern is hydrophobic, at least the hydrophobic group of the sublimable substance is adhered to the surface of the pattern. Therefore, whether the surface of the pattern is hydrophilic or hydrophobic, or alternatively, whether the surface of the pattern includes a hydrophilic portion and a hydrophobic portion, the sublimable substance is held on the surface of the pattern or in its vicinity before the solvent is evaporated.

If the sublimable substance is hydrophilic and the surface of the pattern is hydrophilic, the sublimable substance is attracted to the surface of the pattern due to electrical attractive force. Meanwhile, if the sublimable substance is hydrophobic but the surface of the pattern is hydrophilic, such attractive force is weak or never occurs. Thus, the sublimable substance is unlikely to adhere to the surface of the pattern. Furthermore, if the sublimable substance is hydrophobic, the surface of the pattern is hydrophilic, and patterns have very narrow spacings, it is thought that a sufficient amount of sublimable substance does not enter between the patterns. These phenomena also occur when the sublimable substance is hydrophilic and the surface of the pattern is hydrophobic.

If the solvent is evaporated in a state where no sublimable substance is found on the surface of the pattern or in its vicinity, the solvent in contact with the surface of the pattern may apply a collapsing force to the pattern, so that the pattern may collapse. If the solvent is evaporated in a state where an insufficient amount of sublimable substance is found between patterns, it is also thought that the spacings of the patterns are not filled with the solidified body, so that the pattern is collapsed. By disposing the sublimable substance on the surface of the pattern or in its vicinity before the solvent is evaporated, such collapse can be reduced. This makes it possible to lower the pattern collapse rate.

The hydrophilic group may be any one of a hydroxyl group (hydroxy radical, hydroxyl radical), carboxy group (COOH), amino group ($NH_2$), and carbonyl group (CO) or alternatively, may be one other than those. The hydrophobic group may be any one of a hydrocarbon group, alkyl group ($C_nH_{2n+1}$), cycloalkyl group ($C_nH_{2n+1}$), and phenyl group ($C_6H_5$), or alternatively, may be one other than those.

The adsorbent substance is a substance having sublimability.

According to the method, not only the sublimable substance but also the adsorbent substance has sublimability. The adsorbent substance changes from solid to gas without passing through to a liquid at normal temperature or at normal pressure. If at least a portion of the surface of the pattern is hydrophilic, the solvent is evaporated in a state where the adsorbent substance in the pre-drying processing liquid is adsorbed to the surface of the pattern. The adsorbent substance changes from liquid to solid on the surface of the pattern. This causes the solidified body containing the adsorbent substance and the sublimable substance to be formed. Thereafter, the solid adsorbent substance changes to gas without passing through to a liquid on the surface of the pattern. Therefore, the collapsing force can be lowered as compared with the case in which the liquid is vaporized on the surface of the pattern.

The concentration of the adsorbent substance in the pre-drying processing liquid is lower than the concentration of the solvent in the pre-drying processing liquid.

According to the method, the pre-drying processing liquid with the adsorbent substance having a lower concentration is supplied to the front surface of the substrate. If at least a portion of the surface of the pattern is hydrophilic, the hydrophilic group of the adsorbent substance is adhered to the surface of the pattern, and the monomolecular film of the adsorbent substance is formed along the surface of the pattern. If the adsorbent substance has a high concentration, a plurality of monomolecular films are stacked in layers, and the stacked film of the adsorbent substance is formed along the surface of the pattern. In this case, the sublimable substance is held on the surface of the pattern through the stacked film of the adsorbent substance. If the stacked film of the adsorbent substance is thick, the sublimable substance that enters between patterns is reduced. Therefore, by lowering the concentration of the adsorbent substance, a more sublimable substance can be entered between the patterns.

If at least a portion of the surface of the pattern is hydrophilic, the concentration of the adsorbent substance in the pre-drying processing liquid may take on a value that allows the monomolecular film of the adsorbent substance to be formed on the surface of the pattern or alternatively, may take on a value greater than that. In the former case, the sublimable substance is held on the surface of the pattern through the monomolecular film of the adsorbent substance. Therefore, even if at least a portion of the surface of the pattern is hydrophilic, the sublimable substance can be disposed in the vicinity of the surface of the pattern. Furthermore, since only the thinnest monomolecular film of the adsorbent substance is present between the sublimable substance and the pattern, a sufficient amount of the sublimable substance can enter between the patterns.

The sublimable substance is higher in hydrophobicity than the adsorbent substance. The solubility of the sublimable substance in oil is higher than the solubility of the adsorbent substance in oil. In other words, the solubility of the sublimable substance in water is lower than the solubility of the adsorbent substance in water.

According to the method, the pre-drying processing liquid containing the sublimable substance that is higher in hydrophobicity than the adsorbent substance is supplied to the front surface of the substrate. Both the sublimable substance and the adsorbent substance contain the hydrophobic group. Thus, if at least a portion of the surface of the pattern is hydrophobic, both the sublimable substance and the adsorbent substance can be adhered to the surface of the pattern. However, since the affinity between the sublimable substance and the pattern is higher than the affinity between the adsorbent substance and the pattern, a more sublimable substance than an adsorbent substance is adhered to the surface of the pattern. This allows more sublimable substance to be adhered to the surface of the pattern.

Another preferred embodiment of the present invention provides a substrate processing apparatus including a pre-drying processing liquid supplying unit that supplies a front surface of a substrate, on which a pattern has been formed, with a pre-drying processing liquid containing a sublimable substance that changes to gas without passing through to a liquid and a solvent in which the sublimable substance dissolves, a solidified body forming unit that forms a solidified body containing the sublimable substance on the front surface of the substrate by evaporating the solvent from the pre-drying processing liquid on the front surface of the substrate, and a sublimating unit that removes the solidified body from the front surface of the substrate by sublimating the solidified body. A value acquired by multiplying a ratio of a thickness of the solidified body to a height of the pattern by 100 is greater than 76 and less than 219. The arrangement enables providing the same effects as those of the substrate processing method described above.

Still another preferred embodiment of the present invention provides a pre-drying processing liquid that is to be supplied to a front surface of a substrate before the front surface of the substrate on which a pattern has been formed is dried. The pre-drying processing liquid contains a sublimable substance that changes to gas without passing through to a liquid and a solvent in which the sublimable substance dissolves. The pre-drying processing liquid has a concentration of the sublimable substance in which a value acquired by multiplying a ratio of a thickness of a solidified body to a height of the pattern by 100 is greater than 76 and less than 219 when the solidified body containing the sublimable substance on the front surface of the substrate is formed by evaporating the solvent from the pre-drying processing liquid on the front surface of the substrate. The arrangement enables providing the same effects as those of the substrate processing method described above.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a table showing an example of embedding rates and pattern collapse rates that were acquired when a plurality of samples, on which patterns having similar shapes and strengths had been formed, were processed while the initial concentration of camphor was being altered.

FIG. 12A and FIG. 12B are schematic views for describing a possible mechanism for a phenomenon in which an excessively thicker solidified body causes a higher pattern collapse rate.

FIG. 13A and FIG. 13B are schematic views for describing a possible mechanism for a phenomenon in which an excessively thinner solidified body causes a higher pattern collapse rate.

FIG. 14 is a table showing an example of pattern collapse rates that were acquired when a plurality of samples, on which patterns having similar shapes and strengths had been formed, were processed while the initial concentration of camphor was being altered.

FIG. 15 is a table showing an example of pattern collapse rates that were acquired when a plurality of samples, on which patterns having similar shapes and strengths had been formed, were processed while the initial concentration of camphor was being altered.

FIG. 16 is a table showing an example of pattern collapse rates that were acquired when a plurality of samples, on which patterns having similar shapes and strengths had been formed, were processed while the initial concentration of camphor was being altered.

DETAILED DESCRIPTION OF PREFERRED EMBODIMENTS

In the descriptions below, unless otherwise specified, it is to be understood that the atmospheric pressure inside a substrate processing apparatus 1 is kept at atmospheric pressure inside a clean room in which the substrate processing apparatus 1 is installed (e.g., one atmospheric pressure or a value in its vicinity).

Figure 1A:
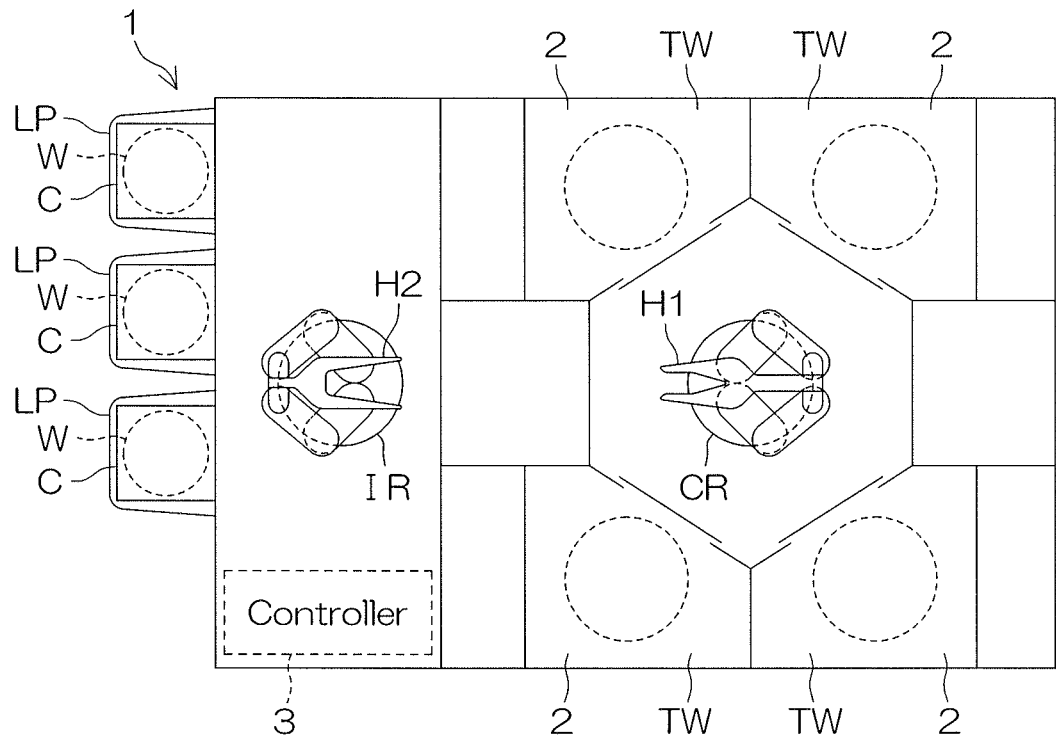
FIG. 1A is a schematic view of a substrate processing apparatus according to a first preferred embodiment of the present invention when viewed from above.
Figure 1B:
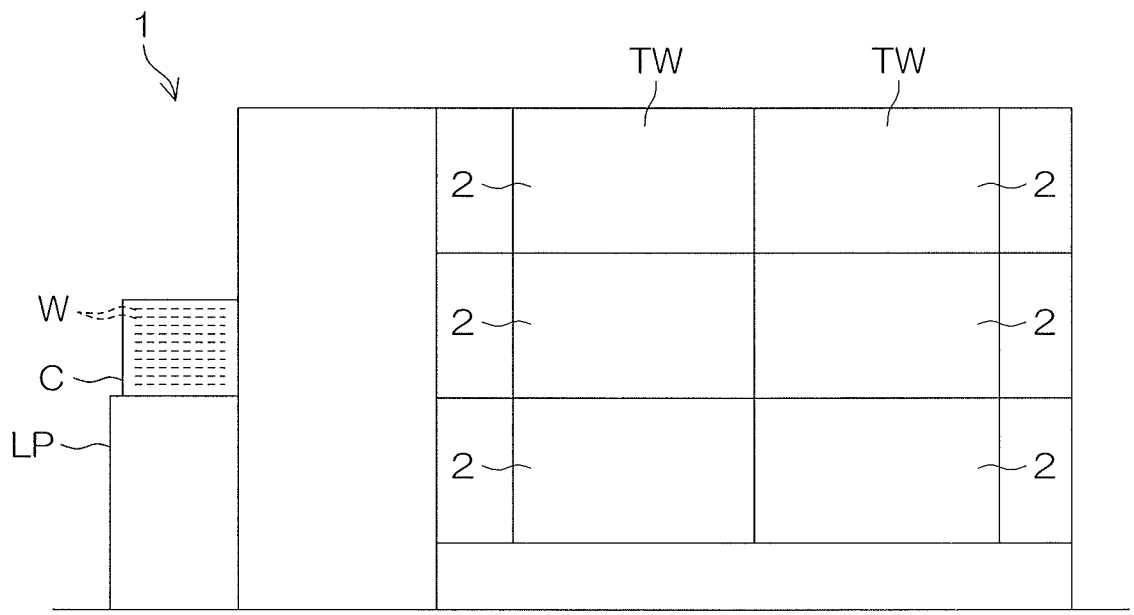
FIG. 1B is a schematic view of the substrate processing apparatus when viewed from the side.

FIG. 1A is a schematic view of a substrate processing apparatus 1 according to a first preferred embodiment of the present invention when viewed from above. FIG. 1B is a schematic view of the substrate processing apparatus 1 when viewed from the side.

As shown in FIG. 1A, the substrate processing apparatus 1 is a single substrate processing-type apparatus which processes disc-shaped substrates W such as a semiconductor wafer one by one. The substrate processing apparatus 1 includes load ports LP which hold carriers C that house one or more substrates W, a plurality of processing units 2 which process the substrates W transferred from the carriers C on the load ports LP with a processing fluid such as a processing liquid or a processing gas, transfer robots which transfer the substrates W between the carriers C on the load ports LP and the processing units 2 and a controller 3 which controls the substrate processing apparatus 1.

The transfer robots include an indexer robot IR which carries the substrates W into and out from the carriers C on the load ports LP and a center robot CR which carries the substrates W into and out from the processing units 2. The indexer robot IR transfers the substrates W between the load ports LP and the center robot CR, the center robot CR transfers the substrates W between the indexer robot IR and the processing units 2. The center robot CR includes hands H1 which support the substrates W and the indexer robot IR includes hands H2 which support the substrates W.

The plurality of processing units 2 forma plurality of towers TW disposed around the center robot CR in a plan view. FIG. 1A shows an example in which four towers TW are formed. The center robot CR is able to access each of the towers TW. As shown in FIG. 1B, each of the towers TW includes the plurality of (for example, three) processing units 2 which are stacked vertically.

Figure 2:
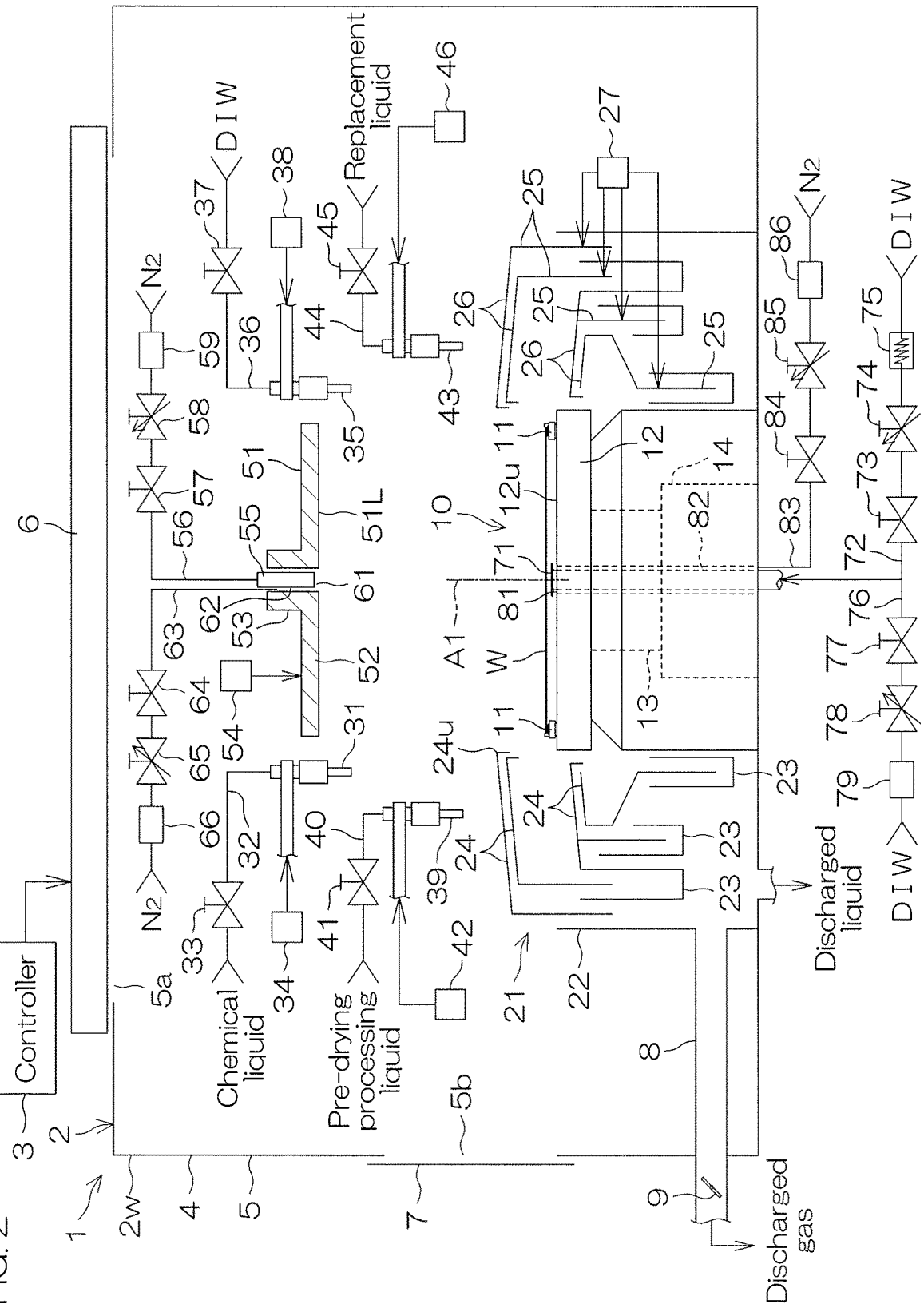
FIG. 2 is schematic view showing the inside of a processing unit, when viewed horizontally, which is provided in the substrate processing apparatus.

FIG. 2 is schematic view showing the inside of a processing unit 2, when viewed horizontally, which is provided in the substrate processing apparatus 1.

The processing unit 2 is a wet-processing unit 2W which provides the processing liquid to the substrate W. The processing unit 2 includes a box-shaped chamber 4 which has an internal space, a spin chuck 10 which rotates one substrate W around a vertical rotation axis A1 passing through the central portion of the substrate W while holding the substrate W horizontally within the chamber 4 and a tubular processing cup 21 which surrounds the spin chuck 10 around the rotation axis A1.

The chamber 4 includes a box-shaped partition wall 5 provided with a carry-in/carry-out port 5b through which the substrate W passes, and a shutter 7 to open and close the carry-in/carry-out port 5b. An FFU 6 (fan filter unit) is disposed on an air outlet 5a that is provided on the upper portion of the partition wall 5. The FFU 6 supplies clean air (filtered air) all the time through the air outlet 5a into the chamber 4. A gas inside the chamber 4 is discharged from the chamber 4 through an exhaust duct 8 that is connected to the bottom portion of the processing cup 21. Thus, the downflow of clean air is formed inside the chamber 4 all the time. The flow rate of the discharged gas that is discharged into the exhaust duct 8 changes depending on the opening degree of an exhaust valve 9 that is disposed inside the exhaust duct 8.

The spin chuck 10 includes a disc-shaped spin base 12 which is held in a horizontal posture, a plurality of chuck pins 11 which hold the substrate W in the horizontal posture above the spin base 12, a spin shaft 13 which extends downward from the central portion of the spin base 12 and a spin motor 14 which rotates the spin base 12 and the chuck pins 11 by rotating the spin shaft 13. The spin chuck 10 is not limited to a clamping type chuck which brings the chuck pins 11 into contact with the outer circumferential surface of the substrate W, and the spin chuck 10 may be a vacuum-type chuck which sucks the rear surface (lower surface) of the substrate W that is a non-device formation surface to the upper surface 12*u* of the spin base 12 so as to hold the substrate W horizontally.

The processing cup 21 includes a plurality of guards 24 to receive a processing liquid discharged outwardly from the substrate W, a plurality of cups 23 to receive the processing liquid guided downwardly by the plurality of guards 24, and a cylindrical outer wall member 22 that surrounds the plurality of guards 24 and the plurality of cups 23. FIG. 2 shows an example in which four guards 24 and three cups 23 are provided, and the outermost cup 23 is integrated with the guard 24 that is the third from the top.

The guard 24 includes a cylindrical portion 25 that surrounds the spin chuck 10, and an annular ceiling portion 26 that extends diagonally upwardly toward the rotation axis A1 from the upper end portion of the cylindrical portion 25. The plurality of ceiling portions 26 are stacked in the vertical direction, and the plurality of cylindrical portions 25 are disposed concentrically. The annular upper end of the ceiling portions 26 corresponds to the upper end 24*u* of the guards 24 that surround the substrate W and the spin base 12 in plan view. The plurality of cups 23 are disposed below the plurality of cylindrical portions 25, respectively. The cup 23 defines an annular liquid-receiving groove that receives a processing liquid that is guided downwardly with the guard 24.

The processing unit 2 includes a guard elevating/lowering unit 27 to individually elevate and lower the plurality of guards 24. The guard elevating/lowering unit 27 locates the guards 24 at an arbitrary position from an upper position to a lower position. FIG. 2 shows a state in which two guards 24 are disposed at an upper position, and the remaining two guards 24 are disposed at a lower position. The upper position is a position in which the upper end 24*u* of the guards 24 is disposed higher than a holding position in which the substrate W held by the spin chuck 10 is disposed. The lower position is a position in which the upper end 24*u* of the guards 24 is disposed lower than the holding position.

A processing liquid is supplied to the rotating substrate W in a state in which at least one guard 24 is disposed at the upper position. In the state, when the processing liquid is supplied to the substrate W, the processing liquid supplied to the substrate W flies off around the substrate W. The flied-off processing liquid collides with the inner surface of the guard 24 horizontally opposing the substrate W, and is then guided with the cup 23 that is associated with the guard 24. This allows the processing liquid discharged from the substrate W to be collected in the processing cup 21.

The processing unit 2 includes a plurality of nozzles to discharge the processing liquid to the substrate W held with the spin chuck 10. The plurality of nozzles include a chemical liquid nozzle 31 to discharge a chemical liquid to the upper surface of the substrate W, a rinse liquid nozzle 35 to discharge a rinse liquid to the upper surface of the substrate W, a pre-drying processing liquid nozzle 39 to discharge the pre-drying processing liquid to the upper surface of the substrate W, and a replacing liquid nozzle 43 to discharge a replacement liquid to the upper surface of the substrate W.

The chemical liquid nozzle 31 may be a scan nozzle that is horizontally movable within the chamber 4 or alternatively, may also be a fixed nozzle that is secured to the partition wall 5 of the chamber 4. The same applies to the rinse liquid nozzle 35, the pre-drying processing liquid nozzle 39, and the replacing liquid nozzle 43. FIG. 2 shows an example in which each of the chemical liquid nozzle 31, the rinse liquid nozzle 35, the pre-drying processing liquid nozzle 39, and the replacing liquid nozzle 43 is a scan nozzle, and four nozzle moving units associated with those four nozzles respectively are provided.

The chemical liquid nozzle 31 is connected to a chemical liquid piping 32 that guides a chemical liquid to the chemical liquid nozzle 31. When a chemical liquid valve 33 interposed in the chemical liquid piping 32 is opened, the chemical liquid is continuously discharged downwardly from the discharge port of the chemical liquid nozzle 31. The chemical liquid to be discharged from the chemical liquid nozzle 31 may be a liquid that contains at least one of sulfuric acid, nitric acid, hydrochloric acid, hydrofluoric acid, phosphorus acid, acetic acid, ammonia water, a hydrogen peroxide solution, organic acid (e.g., such as citric acid or oxalic acid), organic alkaline (e.g., TMAH: tetramethyl ammonium hydroxide), a surface-active agent, and a corrosion inhibitor, or alternatively, may be a solution other than those.

Although not shown, the chemical liquid valve 33 includes a valve body provided with an internal flow path where the liquid flows and an annular valve seat surrounding the internal flow path, a valve member which is movable with respect to the valve seat and an actuator which moves the valve member between a closed position where the valve member contacts the valve seat and an open position where the valve member is separated from the valve seat. The same applies to other valves. The actuator may be a pneumatic actuator or an electric actuator or an actuator other than those. The controller 3 opens and closes the chemical liquid valve 33 by controlling the actuator.

The chemical liquid nozzle 31 is connected to a nozzle moving unit 34 that moves the chemical liquid nozzle 31 at least in one of the vertical and horizontal directions. The nozzle moving unit 34 horizontally moves the chemical liquid nozzle 31 between a processing position, at which the chemical liquid discharged from the chemical liquid nozzle 31 is supplied to the upper surface of the substrate W, and a standby position at which the chemical liquid nozzle 31 is positioned around the processing cup 21 in plan view.

The rinse liquid nozzle 35 is connected to a rinse liquid piping 36 that guides a rinse liquid to the rinse liquid nozzle 35. When a rinse liquid valve 37 interposed in the rinse liquid piping 36 is opened, the rinse liquid is continuously discharged downwardly from the discharge port of the rinse liquid nozzle 35. For example, the rinse liquid discharged from the rinse liquid nozzle 35 is pure water (DIW (Deionized Water)). The rinse liquid may be any one of carbonated water, electrolyzed ion water, hydrogen water, ozone water, and hydrochloric acid water of a diluted concentration (e.g., approximately 10 to 100 ppm).

The rinse liquid nozzle 35 is connected to a nozzle moving unit 38 that moves the rinse liquid nozzle 35 at least in one of the vertical and horizontal directions. The nozzle moving unit 38 horizontally moves the rinse liquid nozzle 35 between the processing position, at which the rinse liquid discharged from the rinse liquid nozzle 35 is supplied to the upper surface of the substrate W, and the standby position at which the rinse liquid nozzle 35 is located around the processing cup 21 in plan view.

The pre-drying processing liquid nozzle 39 is connected to a pre-drying processing liquid piping 40 that guides the processing liquid to the pre-drying processing liquid nozzle 39. When a pre-drying processing liquid valve 41 interposed in the pre-drying processing liquid piping 40 is opened, the pre-drying processing liquid is continuously discharged downwardly from the discharge port of the pre-drying processing liquid nozzle 39. Likewise, the replacing liquid nozzle 43 is connected to a replacing liquid piping 44 that guides a replacement liquid to the replacing liquid nozzle 43. When a replacing liquid valve 45 interposed in the replacing liquid piping 44 is opened, the replacement liquid is continuously discharged downwardly from the discharge port of the replacing liquid nozzle 43.

The pre-drying processing liquid is a solution that contains a sublimable substance corresponding to a solute, and a solvent in which the sublimable substance dissolves. The sublimable substance may be a substance that changes from solid to gas without passing through to a liquid at normal temperature (the same as the room temperature) or at normal pressure (the pressure inside the substrate processing apparatus 1, e.g., at one atmospheric pressure or a value in its vicinity). The solvent may be such a substance or other than that. That is, the pre-drying processing liquid may contain two or more types of substances that change from solid to gas without passing through to a liquid at normal temperature or at normal pressure.

For example, the sublimable substance may be any one of alcohol (for example, 2-methyl-2-propanol (alias: tert-butyl alcohol, t-butyl alcohol, tertiary butyl alcohol) or cyclohexanol), a fluorinated hydrocarbon compound, 1,3,5-trioxane (alias: metaformaldehyde), camphor, naphthalene, iodine, and cyclohexane, or alternatively, may be a substance other than those.

For example, the solvent may be at least one type selected from the group consisting of pure water, IPA, HFE (hydrofluoroether), acetone, PGMEA (propylene glycol monomethyl ether acetate), PGEE (propylene glycol monoethyl ether, 1-ethoxy-2-propanol), ethylene glycol, and hydrofluorocarbon.

Now, description will be made below for an example in which the sublimable substance is camphor, and the solvent is any one of IPA, acetone, and PGEE. The vapor pressure of IPA is higher than that of camphor. Likewise, the vapor pressures of acetone and PGEE are higher than the vapor pressure of camphor. The vapor pressure of acetone is higher than that of IPA, and the vapor pressure of IPA is higher than that of PGEE. The freezing point of camphor (the freezing point at one atmospheric pressure; the same applies hereinafter) is 175 to 177° C. Even if the solvent is any one of IPA, acetone, and PGEE, the freezing point of camphor is higher than the boiling point of the solvent. The freezing point of camphor is higher than that of the pre-drying processing liquid. The freezing point of the pre-drying processing liquid is lower than the room temperature (23° C. or a value in its vicinity). The substrate processing apparatus 1 is disposed inside a clean room that is maintained at room temperature. Therefore, even without heating the pre-drying processing liquid, the pre-drying processing liquid can be maintained in the form of liquid. The freezing point of the pre-drying processing liquid may be equal to or greater than room temperature.

As described below, the replacement liquid is supplied to the upper surface of the substrate W covered with the liquid film of the rinse liquid, and the pre-drying processing liquid is supplied to the upper surface of the substrate W covered with the liquid film of the replacement liquid. The replacement liquid is a liquid that dissolves with both the rinse liquid and the pre-drying processing liquid. For example, the replacement liquid is IPA or HFE. The replacement liquid may be a liquid mixture of IPA and HFE or may contain at least one of IPA and HFE and a component other than those. The IPA and HFE is a liquid that dissolves with both water and a fluorinated hydrocarbon compound.

When the replacement liquid is supplied to the upper surface of the substrate W covered with the liquid film of rinse liquid, most of the rinse liquid on the substrate W is washed away by the replacement liquid and thus discharged from the substrate W. The small amount of remaining rinse liquid is dissolved in the replacement liquid to be diffused into the replacement liquid. The diffused rinse liquid is discharged from the substrate W together with the replacement liquid. Therefore, the rinse liquid on the substrate W can be efficiently replaced with the replacement liquid. For the same reason, the replacement liquid on the substrate W can be efficiently replaced with the pre-drying processing liquid. This makes it possible to reduce the rinse liquid contained in the pre-drying processing liquid on the substrate W.

The pre-drying processing liquid nozzle 39 is connected to a nozzle moving unit 42 that moves the pre-drying processing liquid nozzle 39 at least in one of the vertical and horizontal directions. The nozzle moving unit 42 horizontally moves the pre-drying processing liquid nozzle 39 between the processing position, at which the pre-drying processing liquid discharged from the pre-drying processing liquid nozzle 39 is supplied to the upper surface of the substrate W, and the standby position at which the pre-drying processing liquid nozzle 39 is located around the processing cup 21 in plan view.

Likewise, the replacing liquid nozzle 43 is connected to a nozzle moving unit 46 that moves the replacing liquid nozzle 43 at least in one of the vertical and horizontal directions. The nozzle moving unit 46 horizontally moves the replacing liquid nozzle 43 between the processing position, at which the replacement liquid discharged from the replacing liquid nozzle 43 is supplied to the upper surface of the substrate W, and the standby position at which the replacing liquid nozzle 43 is located around the processing cup 21 in plan view.

The processing unit 2 includes a shielding member 51 that is disposed above the spin chuck 10. FIG. 2 shows an example in which the shielding member 51 is a disc-shaped shielding plate. The shielding member 51 includes a disc portion 52 that is horizontally disposed above the spin chuck 10. The shielding member 51 is horizontally supported by a tubular support shaft 53 that extends upwardly from the center portion of the disc portion 52. The center line of the disc portion 52 is disposed on the rotation axis A1 of the substrate W. The lower surface of the disc portion 52 corresponds to the lower surface 51L of the shielding member 51. The lower surface 51L of the shielding member 51 is an opposing surface that faces the upper surface of the substrate W. The lower surface 51L of shielding member 51 is parallel to the upper surface of the substrate W, and has an outer diameter that is equal to or greater than the diameter of the substrate W.

The shielding member 51 is connected to a shielding member elevating/lowering unit 54 that vertically elevates or lowers the shielding member 51. The shielding member elevating/lowering unit 54 locates the shielding member 51 at an arbitrary position from the upper position (the position shown in FIG. 2) to the lower position. The lower position is the proximity position at which the shielding member 51 is located at a height in which the lower surface 51L of the shielding member 51 comes into proximity to the upper surface of the substrate W and a scan nozzle such as the chemical liquid nozzle 31 cannot enter between the substrate W and the shielding member 51. The upper position is the separate position at which the shielding member 51 retracts to a height in which the scan nozzle is able to enter between the shielding member 51 and the substrate W.

The plurality of nozzles include a central nozzle 55 that downwardly discharges a processing fluid such as a processing liquid or a processing gas through an upper central opening 61 that is opened at the center portion of the lower surface 51L of the shielding member 51. The central nozzle 55 extends vertically along the rotation axis A1. The central nozzle 55 is disposed inside a through-hole that vertically penetrates the center portion of the shielding member 51. The inner circumferential surface of the shielding member 51 surrounds the outer circumferential surface of the central nozzle 55 with a spacing in the radial direction (in the direction orthogonal to the rotation axis A1). The central nozzle 55 is elevated or lowered together with the shielding member 51. The discharge port of the central nozzle 55 to discharge the processing liquid is disposed above the upper central opening 61 of the shielding member 51.

The central nozzle 55 is connected to an upper gas piping 56 that guides an inert gas to the central nozzle 55. The substrate processing apparatus 1 may include an upper thermoregulator 59 that heats or cools the inert gas to be discharged from the central nozzle 55. When an upper gas valve 57 interposed in the upper gas piping 56 is opened, the inert gas is continuously discharged downwardly from the discharge port of the central nozzle 55 at a flow rate corresponding to the opening degree of a flow rate adjusting valve 58 that changes the flow rate of the inert gas. The inert gas discharged from the central nozzle 55 is a nitrogen gas. The inert gas may be a gas other than the nitrogen gas such as a helium gas or an argon gas.

The inner circumferential surface of the shielding member 51 and the outer circumferential surface of the central nozzle 55 define a tubular upper gas flow pas sage 62 that extends vertically. The upper gas flow passage 62 is connected to an upper gas piping 63 that guides the inert gas to the upper central opening 61 of the shielding member 51. The substrate processing apparatus 1 may include an upper thermoregulator 66 that heats or cools the inert gas to be discharged from the upper central opening 61 of the shielding member 51. When an upper gas valve 64 interposed in the upper gas piping 63 is opened, the inert gas is continuously discharged downwardly from the upper central opening 61 of the shielding member 51 at a flow rate corresponding to the opening degree of a flow rate adjusting valve 65 that changes the flow rate of the inert gas. The inert gas discharged from the upper central opening 61 of the shielding member 51 is a nitrogen gas. The inert gas may be a gas other than the nitrogen gas such as a helium gas or an argon gas.

The plurality of nozzles include a lower-surface nozzle 71 that discharges the processing liquid to the center portion of the lower surface of the substrate W. The lower-surface nozzle 71 includes a nozzle disc portion that is disposed between the upper surface 12u of the spin base 12 and the lower surface of the substrate W, and a nozzle cylindrical portion that downwardly extends from the nozzle disc portion. The discharge port of the lower-surface nozzle 71 is opened at the center portion of the upper surface of the nozzle disc portion. When the substrate W is held on the spin chuck 10, the discharge port of the lower-surface nozzle 71 vertically faces the center portion of the lower surface of the substrate W.

The lower-surface nozzle 71 is connected to a heating fluid piping 72 that guides hot water (pure water at a temperature higher than room temperature) serving as an example of heating fluid to the lower-surface nozzle 71. The pure water supplied to the lower-surface nozzle 71 is heated by a lower heater 75 that is interposed in the heating fluid piping 72. When a heating fluid valve 73 interposed in the heating fluid piping 72 is opened, the hot water is discharged continuously upwardly from the discharge port of the lower-surface nozzle 71 at a flow rate corresponding to the opening degree of a flow rate adjusting valve 74 that changes the flow rate of the hot water. This allows the hot water to be supplied to the lower surface of the substrate W.

Furthermore, the lower-surface nozzle 71 is connected to a cooling fluid piping 76 that guides cold water (pure water at a temperature lower than room temperature) serving as an example of cooling fluid to the lower-surface nozzle 71. The pure water supplied to the lower-surface nozzle 71 is cooled by a cooler 79 interposed in the cooling fluid piping 76. When a cooling fluid valve 77 interposed in the cooling fluid piping 76 is opened, the cold water is continuously discharged upwardly from the discharge port of the lower-surface nozzle 71 at a flow rate associated with the opening degree of a flow rate adjusting valve 78 that changes the flow rate of the cold water. This allows the cold water to be supplied to the lower surface of the substrate W.

The outer circumferential surface of the lower-surface nozzle 71 and the inner circumferential surface of the spin base 12 define a tubular lower gas flow passage 82 that extends vertically. The lower gas flow passage 82 includes a lower central opening 81 that is opened at the center portion of the upper surface 12u of the spin base 12. The lower gas flow passage 82 is connected to a lower gas piping 83 that guides the inert gas to the lower central opening 81 of the spin base 12. The substrate processing apparatus 1 may include a lower thermoregulator 86 that heats or cools the inert gas to be discharged from the lower central opening 81 of the spin base 12. When a lower gas valve 84 interposed in the lower gas piping 83 is opened, the inert gas is continuously discharged upwardly from the lower central opening 81 of the spin base 12 at a flow rate corresponding to the opening degree of a flow rate adjusting valve 85 that changes the flow rate of the inert gas.

The inert gas discharged from the lower central opening 81 of the spin base 12 is a nitrogen gas. The inert gas may be a gas other than the nitrogen gas such as a helium gas or an argon gas. When the lower central opening 81 of the spin base 12 discharges the nitrogen gas with the substrate W held on the spin chuck 10, the nitrogen gas radially flows in all directions between the lower surface of the substrate W and the upper surface 12u of the spin base 12. This allows the space between the substrate W and the spin base 12 to be filled with the nitrogen gas.

Next, description will be made below to a pre-drying processing liquid supplying unit.

Figure 3:
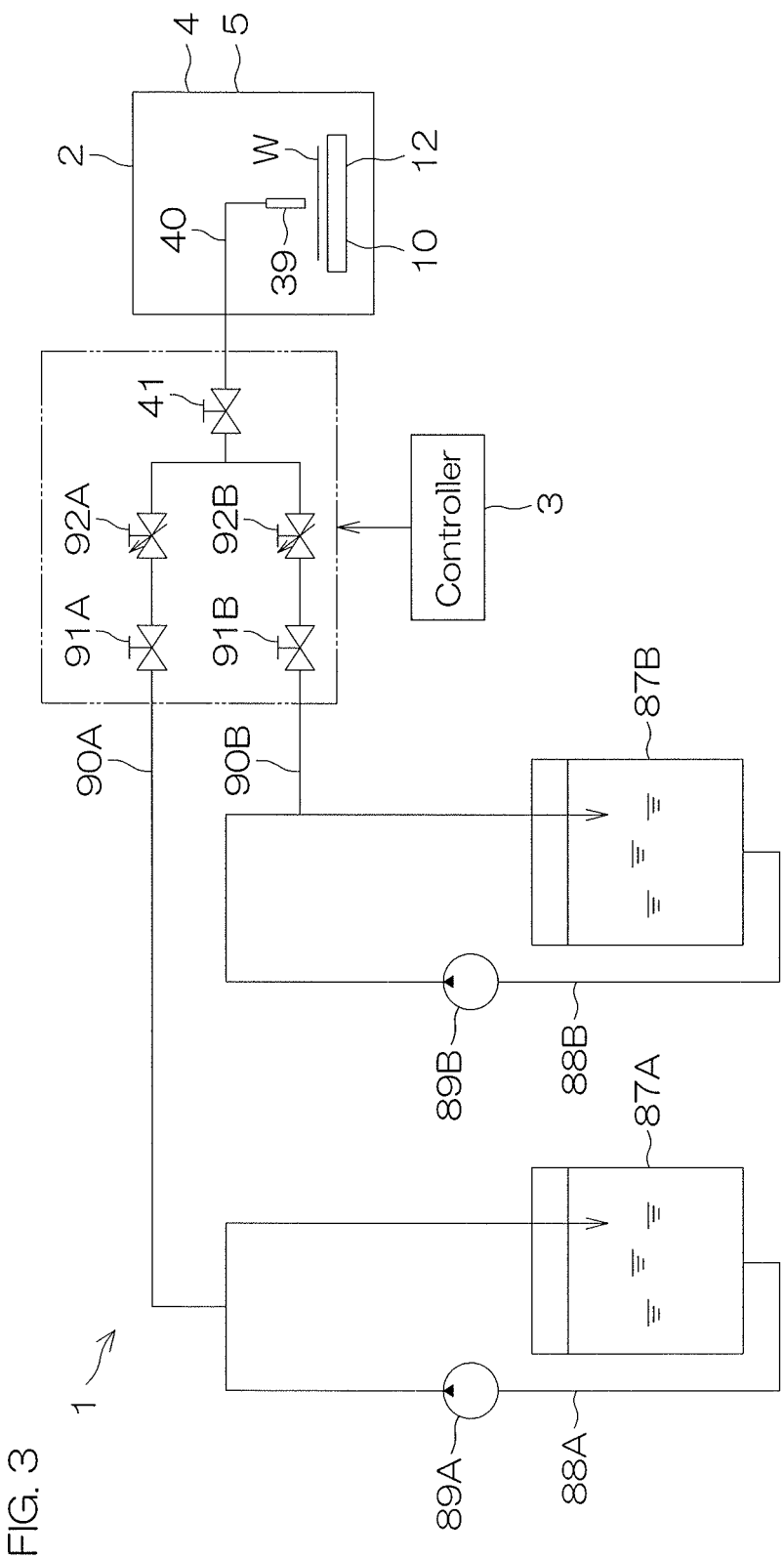
FIG. 3 is a schematic view showing a pre-drying processing liquid supplying unit provided in the substrate processing apparatus.

FIG. 3 is a schematic view showing the pre-drying processing liquid supplying unit provided in the substrate processing apparatus 1.

The substrate processing apparatus 1 includes the pre-drying processing liquid supplying unit that supplies the pre-drying processing liquid to the pre-drying processing liquid nozzle 39 through the pre-drying processing liquid piping 40.

The pre-drying processing liquid supplying unit includes a first tank 87A to store the pre-drying processing liquid, a first circulation piping 88A to circulate the pre-drying processing liquid inside the first tank 87A, a first pump 89A to feed the pre-drying processing liquid inside the first tank 87A to the first circulation piping 88A, and a first individual piping 90A that guides the pre-drying processing liquid inside the first circulation piping 88A to the pre-drying processing liquid piping 40. The pre-drying processing liquid supplying unit further includes a first opening/closing valve 91A to open/close the inside of the first individual piping 90A, and a first flow rate adjusting valve 92A that changes the flow rate of the pre-drying processing liquid supplied from the first individual piping 90A to the pre-drying processing liquid piping 40.

The pre-drying processing liquid supplying unit includes a second tank 87B to store the pre-drying processing liquid, a second circulation piping 88B to circulate the pre-drying processing liquid inside the second tank 87B, a second pump 89B to feed the pre-drying processing liquid inside the second tank 87B to the second circulation piping 88B, and a second individual piping 90B that guides the pre-drying processing liquid inside the second circulation piping 88B to the pre-drying processing liquid piping 40. Furthermore, the pre-drying processing liquid supplying unit includes a second opening/closing valve 91B to open/close the inside of the second individual piping 90B, and a second flow rate adjusting valve 92B that changes the flow rate of the pre-drying processing liquid supplied from the second individual piping 90B to the pre-drying processing liquid piping 40.

The concentration of the pre-drying processing liquid inside the first tank 87A (the concentration of the sublimable substance contained in the pre-drying processing liquid) is different from the concentration of the pre-drying processing liquid inside the second tank 87B. Therefore, when the first opening/closing valve 91A and the second opening/closing valve 91B are opened, the pre-drying processing liquids having mutually different concentrations are mixed together within the pre-drying processing liquid piping 40, so that the pre-drying processing liquid that has been uniformly mixed is discharged from the pre-drying processing liquid nozzle 39. Furthermore, when at least one opening degree of the first flow rate adjusting valve 92A and the second flow rate adjusting valve 92B is changed, the concentration of the pre-drying processing liquid to be discharged from the pre-drying processing liquid nozzle 39 is changed.

The controller 3 sets the opening degrees of the first opening/closing valve 91A, the second opening/closing valve 91B, the first flow rate adjusting valve 92A, and the second flow rate adjusting valve 92B in accordance with the concentration of the pre-drying processing liquid specified in a recipe described below. For example, in the case where the concentration of the pre-drying processing liquid specified in the recipe matches the concentration of the pre-drying processing liquid inside the first tank 87A, the first opening/closing valve 91A is opened, and the second opening/closing valve 91B is kept closed. In the case where the concentration of the pre-drying processing liquid specified in the recipe has a value between the concentration of the pre-drying processing liquid inside the first tank 87A and the concentration of the pre-drying processing liquid inside the second tank 87B, both the first opening/closing valve 91A and the second opening/closing valve 91B are opened, and then the opening degrees of the first flow rate adjusting valve 92A and the second flow rate adjusting valve 92B are adjusted. This allows the concentration of the pre-drying processing liquid discharged from the pre-drying processing liquid nozzle 39 to be brought close to the concentration of the pre-drying processing liquid specified in the recipe.

Figure 4:
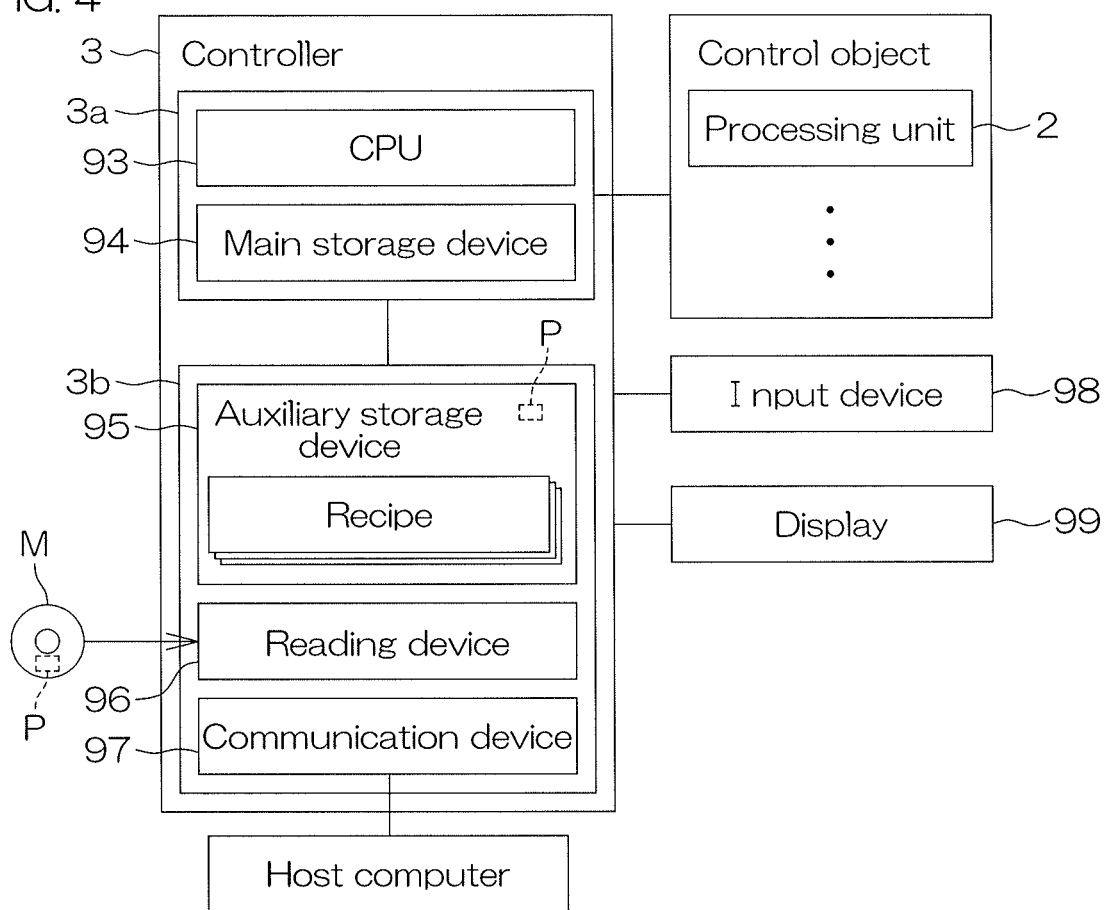
FIG. 4 is a block diagram showing the hardware of a controller.

FIG. 4 is a block diagram showing the hardware of the controller 3.

The controller 3 is a computer which includes a computer main body 3a and a peripheral device 3b which is connected to the computer main body 3a. The computer main body 3a includes a CPU 93 (central processing unit) which executes various types of commands and a main storage device 94 which stores information. The peripheral device 3b includes an auxiliary storage device 95 which stores information such as a program P, a reading device 96 which reads information from a removable medium M and a communication device 97 which communicates with other devices such as a host computer.

The controller 3 is connected to an input device 98 and a display 99. The input device 98 is operated when an operator such as a user or a maintenance operator inputs information to the substrate processing apparatus 1. The information is displayed on the screen of the display 99. The input device 98 may be any one of a keyboard, a pointing device and a touch panel or may be a device other than those. A touch panel display which serves both as the input device 98 and the display 99 may be provided in the substrate processing apparatus 1.

The CPU 93 executes the program P stored in the auxiliary storage device 95. The program P within the auxiliary storage device 95 may be previously installed in the controller 3, may be fed through the reading device 96 from the removable medium M to the auxiliary storage device 95 or may be fed from an external device such as the host computer to the auxiliary storage device 95 through the communication device 97.

The auxiliary storage device 95 and the removable medium M are nonvolatile memories which retain memory even without power being supplied. The auxiliary storage device 95 is, for example, a magnetic storage device such as a hard disk drive. The removable medium M is, for example, an optical disc such as a compact disc or a semiconductor memory such as a memory card. The removable medium M is an example of a computer readable recording medium in which the program P is recorded. The removable medium M is a non-transitory tangible recording medium.

The auxiliary storage device 95 stores a plurality of recipes. The recipe is information which specifies the details of processing, processing conditions and processing procedures of the substrate W. A plurality of recipes differ from each other in at least one of the details of processing, the processing conditions and the processing procedures of the substrate W. The controller 3 controls the substrate processing apparatus 1 such that the substrate W is processed according to the recipe designated by the host computer. The controller 3 executes individual steps described below by controlling the substrate processing apparatus 1. In other words, the controller 3 is programmed to execute the individual steps described below.

Next, description will be made below to an example of processing the substrate W according to the first preferred embodiment.

For example, the substrate W to be processed is a semiconductor wafer such as a silicon wafer. The front surface of the substrate W corresponds to the device formation surface on which devices such as transistors or capacitors are formed. The substrate W may be a substrate W having patterns P1 (see FIG. 6A) formed on the front surface of the substrate W corresponding to a pattern formation surface, or alternatively, may be a substrate W having no patterns P1 formed on the front surface of the substrate W. In the latter case, the patterns P1 may be formed in a chemical liquid supplying step described below.

Figure 5:
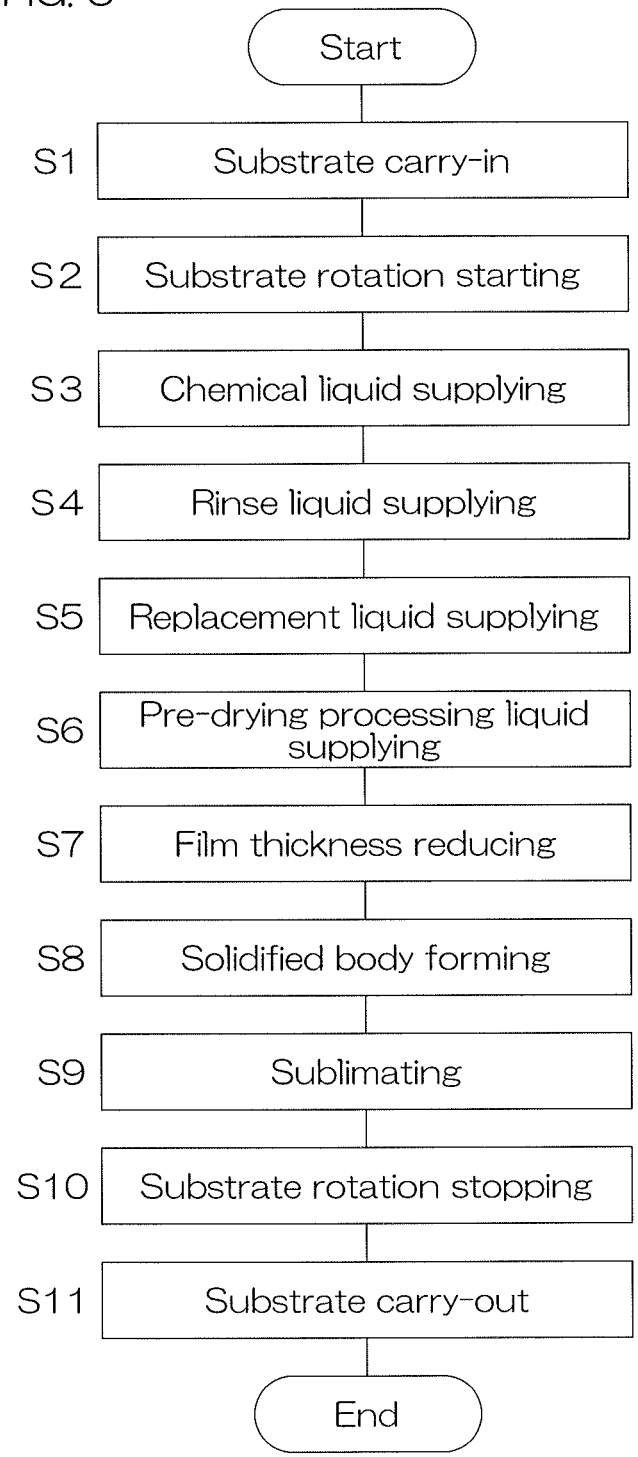
FIG. 5 is a process chart for describing an example of substrate processing according to the first preferred embodiment.
Figure 6A:
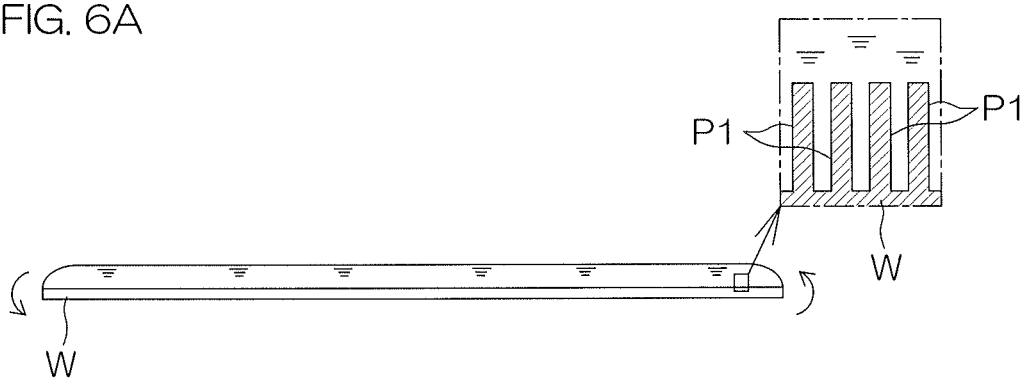
FIG. 6A is a schematic view showing the state of the substrate when the substrate processing shown in FIG. 5 is performed.
Figure 6B:
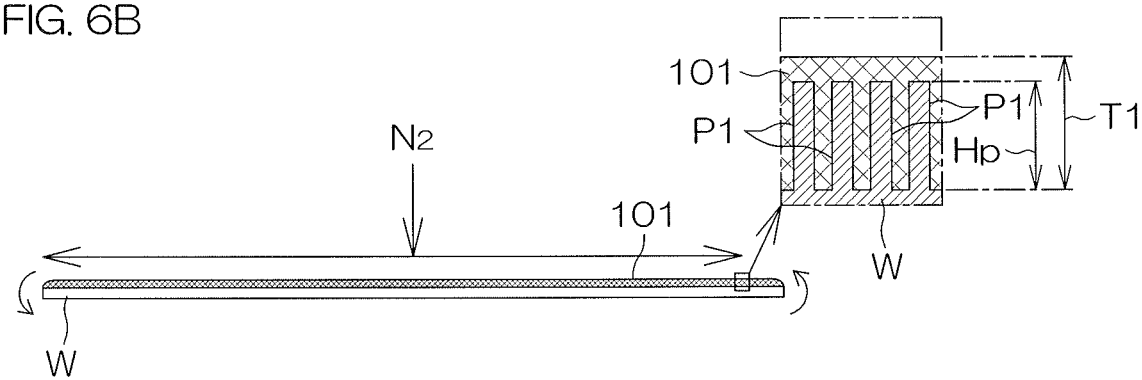
FIG. 6B is a schematic view showing the state of the substrate when the substrate processing shown in FIG. 5 is performed.
Figure 6C:
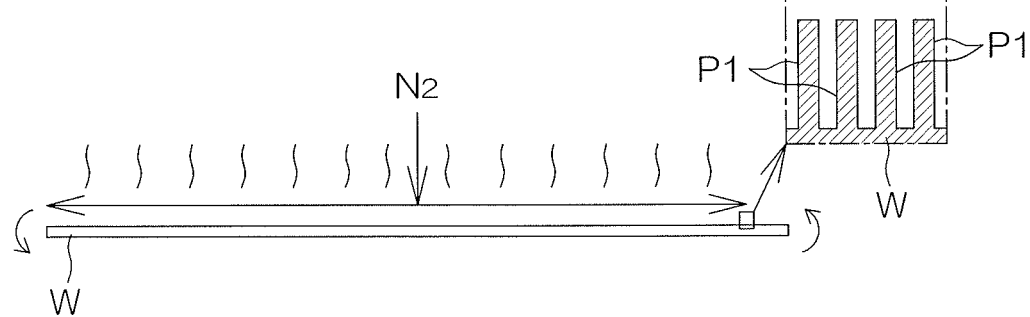
FIG. 6C is a schematic view showing the state of the substrate when the substrate processing shown in FIG. 5 is performed.

FIG. 5 is a process chart for describing an example of processing the substrate W according to the first preferred embodiment. FIG. 6A to FIG. 6C are schematic views showing the state of the substrate W when the processing the substrate W shown in FIG. 5 is being performed.

FIG. 2 and FIG. 5 will be referred to below. FIG. 6A to FIG. 6C will be referred to as appropriate.

When the substrate W is processed in the substrate processing apparatus 1, a carry-in step (step S1 in FIG. 5) is performed to carry the substrate W into the chamber 4.

Specifically, while the shielding member 51 is located at the upper position, all the guards 24 are located at the lower position, and all scan nozzles are located at the standby position, the center robot CR (see FIG. 1) causes a hand H1 to enter the chamber 4 while supporting the substrate W with the hand H1. Then, the center robot CR places the substrate W in the hand H1 on the plurality of chuck pins 11 while the front surface of the substrate W is directed upwardly. Thereafter, the plurality of chuck pins 11 are pushed against the outer circumferential surface of the substrate W to thereby grip the substrate W. The center robot CR retracts the hand H1 out of the chamber 4 after having placed the substrate W on the spin chuck 10.

Next, the upper gas valve 64 and the lower gas valve 84 are opened, and the upper central opening 61 of the shielding member 51 and the lower central opening 81 of the spin base 12 start to discharge the nitrogen gas. This allows the space between the substrate W and the shielding member 51 to be filled with the nitrogen gas. Likewise, the space between the substrate W and the spin base 12 is filled with the nitrogen gas. Meanwhile, the guard elevating/lowering unit 27 elevates at least one guard 24 from the lower position to the upper position. Thereafter, the spin motor 14 is driven, and the rotation of the substrate W is started (step S2 in FIG. 5). This allows the substrate W to be rotated at a liquid supplying speed.

Next, the chemical liquid supplying step (step S3 in FIG. 5) is performed to supply a chemical liquid onto the upper surface of the substrate W and thereby form a liquid film of the chemical liquid that covers the entire upper surface of the substrate W.

Specifically, with the shielding member 51 located at the upper position and at least one guard 24 located at the upper position, the nozzle moving unit 34 moves the chemical liquid nozzle 31 from the standby position to the processing position. Thereafter, the chemical liquid valve 33 is opened, and the chemical liquid nozzle 31 starts to discharge the chemical liquid. When a predetermined time has elapsed after the chemical liquid valve 33 is opened, the chemical liquid valve 33 is closed, so that the discharge of the chemical liquid is stopped. Thereafter, the nozzle moving unit 34 moves the chemical liquid nozzle 31 to the standby position.

The chemical liquid discharged from the chemical liquid nozzle 31 collides with the upper surface of the substrate W that is rotating at the liquid supplying speed, and then, flows outwardly along the upper surface of the substrate W due to centrifugal force. Thus, the chemical liquid is supplied to the entire upper surface of the substrate W to thereby form the liquid film of the chemical liquid that covers the entire upper surface of the substrate W. While the chemical liquid nozzle 31 is discharging the chemical liquid, the nozzle moving unit 34 may move a liquid landing position so that the liquid landing position of the chemical liquid passes the center portion and the outer circumference portion of the upper surface of the substrate W, or alternatively, may bring the liquid landing position to a standstill at the center portion.

Next, a rinse liquid supplying step (step S4 in FIG. 5) is performed to supply pure water serving as an example of rinse liquid to the upper surface of the substrate W and thereby wash away the chemical liquid on the substrate W.

Specifically, with the shielding member 51 located at the upper position and at least one guard 24 located at the upper position, the nozzle moving unit 38 moves the rinse liquid nozzle 35 from the standby position to the processing position. Thereafter, the rinse liquid valve 37 is opened, and the rinse liquid nozzle 35 starts to discharge the rinse liquid. Before the pure water starts to be discharged, the guard elevating/lowering unit 27 may vertically move at least one guard 24 in order to switch the guard 24 that receives the liquid discharged from the substrate W. When a predetermined time has elapsed after the rinse liquid valve 37 is opened, the rinse liquid valve 37 is closed, so that the discharge of the rinse liquid is stopped. Thereafter, the nozzle moving unit 38 moves the rinse liquid nozzle 35 to the standby position.

The pure water discharged from the rinse liquid nozzle 35 collides with the upper surface of the substrate W that is rotating at the liquid supplying speed, and then, flows outwardly along the upper surface of the substrate W due to centrifugal force. The chemical liquid on the substrate W is replaced with the pure water discharged from the rinse liquid nozzle 35. This allows a liquid film of the pure water covering the entire upper surface of the substrate W to be formed. While the rinse liquid nozzle 35 is discharging the pure water, the nozzle moving unit 38 may move a liquid landing position so that the liquid landing position of the pure water passes the center portion and the outer circumference portion of the upper surface of the substrate W, or alternatively, may bring the liquid landing position to a standstill at the center portion.

Next, a replacement liquid supplying step (step S5 in FIG. 5) is performed to supply a replacement liquid that dissolves with both the rinse liquid and the pre-drying processing liquid to the upper surface of the substrate W and then replace the pure water on the substrate W with the replacement liquid.

Specifically, with the shielding member 51 located at the upper position and at least one guard 24 located at the upper position, the nozzle moving unit 46 moves the replacing liquid nozzle 43 from the standby position to the processing position. Thereafter, the replacing liquid valve 45 is opened, and the replacing liquid nozzle 43 starts to discharge the replacement liquid. Before the replacement liquid starts to be discharged, the guard elevating/lowering unit 27 may vertically move at least one guard 24 in order to switch the guard 24 that receives the liquid discharged from the substrate W. When a predetermined time has elapsed after the replacing liquid valve 45 is opened, the replacing liquid valve 45 is closed, so that the discharge of the replacement liquid is stopped. Thereafter, the nozzle moving unit 46 moves the replacing liquid nozzle 43 to the standby position.

The replacement liquid discharged from the replacing liquid nozzle 43 collides with the upper surface of the substrate W that is rotating at the liquid supplying speed, and then, flows outwardly along the upper surface of the substrate W due to centrifugal force. The pure water on the substrate W is replaced with the replacement liquid discharged from the replacing liquid nozzle 43. This allows a liquid film of the replacement liquid covering the entire upper surface of the substrate W to be formed. While the replacing liquid nozzle 43 is discharging the replacement liquid, the nozzle moving unit 46 may move a liquid landing position so that the liquid landing position of the replacement liquid passes the center portion and the outer circumference portion of the upper surface of the substrate W, or alternatively, may bring the liquid landing position to a standstill at the center portion. After the liquid film of the replacement liquid covering the entire upper surface of the substrate W is formed, the substrate W may be rotated at a paddle speed (e.g., at a speed greater than zero and 20 rpm or less) while the discharge of the replacement liquid from the replacing liquid nozzle 43 is stopped.

Next, a pre-drying processing liquid supplying step (step S6 in FIG. 5) is performed to supply the pre-drying processing liquid to the upper surface of the substrate W and thereby form a liquid film of the pre-drying processing liquid on the substrate W.

Specifically, with the shielding member 51 located at the upper position and at least one guard 24 located at the upper position, the nozzle moving unit 42 moves the pre-drying processing liquid nozzle 39 from the standby position to the processing position. Thereafter, the pre-drying processing liquid valve 41 is opened, and the pre-drying processing liquid nozzle 39 starts to discharge the pre-drying processing liquid. Before the pre-drying processing liquid starts to be discharged, the guard elevating/lowering unit 27 may vertically move at least one guard 24 in order to switch the guard 24 that receives the liquid discharged from the substrate W. When a predetermined time has elapsed after the pre-drying processing liquid valve 41 is opened, the pre-drying processing liquid valve 41 is closed, so that the discharge of the pre-drying processing liquid is stopped. Thereafter, the nozzle moving unit 42 moves the pre-drying processing liquid nozzle 39 to the standby position.

The pre-drying processing liquid discharged from the pre-drying processing liquid nozzle 39 collides with the upper surface of the substrate W that is rotating at the liquid supplying speed, and then, flows outwardly along the upper surface of the substrate W due to centrifugal force. The replacement liquid on the substrate W is replaced with the pre-drying processing liquid discharged from the pre-drying processing liquid nozzle 39. This allows a liquid film of the pre-drying processing liquid covering the entire upper surface of the substrate W to be formed. While the pre-drying processing liquid nozzle 39 is discharging the pre-drying processing liquid, the nozzle moving unit 42 may move a liquid landing position so that the liquid landing position of the pre-drying processing liquid passes the center portion and the outer circumference portion of the upper surface of the substrate W, or alternatively, may bring the liquid landing position to a standstill at the center portion.

Next, a film thickness reducing step (step S7 in FIG. 5) is performed to remove some of the pre-drying processing liquid on the substrate W and thereby reduce the film thickness (the thickness of the liquid film) of the pre-drying processing liquid on the substrate W while maintaining the state that the entire upper surface of the substrate W is covered with the liquid film of the pre-drying processing liquid.

Specifically, with the shielding member 51 located at the lower position, the spin motor 14 maintains the rotational speed of the substrate W at a film thickness reducing speed. The film thickness reducing speed may be equal to or different from the liquid supplying speed. The pre-drying processing liquid on the substrate W is discharged outwardly from the substrate W due to centrifugal force even after the discharge of the pre-drying processing liquid is stopped. Thus, the thickness of the liquid film of the pre-drying processing liquid on the substrate W is reduced. When the pre-drying processing liquid on the substrate W is discharged to a certain extent, the amount of the pre-drying processing liquid discharged from the substrate W per unit time is reduced to zero or generally zero. Thereby, the thickness of the liquid film of the pre-drying processing liquid on the substrate W is stabilized at a value corresponding to the rotational speed of the substrate W.

Next, a solidified body forming step (step S8 in FIG. 5) is performed to solidify the pre-drying processing liquid on the substrate W and thereby form a solidified body 101 containing a sublimable substance (see FIG. 6B) on the substrate W.

Specifically, with the shielding member 51 located at the lower position, the spin motor 14 maintains the rotational speed of the substrate W at a solidified body forming speed. The solidified body forming speed may be equal to or different from the liquid supplying speed. Furthermore, the upper gas valve 57 is opened to cause the central nozzle 55 to start discharging the nitrogen gas. In addition to or in place of opening the upper gas valve 57, the opening degree of the flow rate adjusting valve 65 may be changed to increase the flow rate of the nitrogen gas discharged from the upper central opening 61 of the shielding member 51.

For example, when the substrate W starts to be rotated at the solidified body forming speed, the evaporation of the pre-drying processing liquid is accelerated, so that some of the pre-drying processing liquid on the substrate W evaporates. Since the vapor pressure of the solvent is higher than that of the sublimable substance corresponding to a solute, the solvent evaporates at an evaporation rate greater than that of the sublimable substance. Therefore, while the concentration of the sublimable substance gradually increases, the film thickness of the pre-drying processing liquid gradually decreases. The freezing point of the pre-drying processing liquid increases with increasing concentrations of the sublimable substance. As can be seen from a comparison between FIG. 6A and FIG. 6B, when the freezing point of the pre-drying processing liquid reaches the temperature of the pre-drying processing liquid, the pre-drying processing liquid starts to solidify, so that the solidified body 101, which corresponds to a solidified film covering the entire upper surface of the substrate W, is formed.

Next, a sublimating step (step S9 in FIG. 5) is performed to sublimate the solidified body 101 on the substrate W and thereby remove the solidified body 101 from the upper surface of the substrate W.

Specifically, with the shielding member 51 located at the lower position, the spin motor 14 maintains the rotational speed of the substrate W at a sublimating speed. The sublimating speed may be equal to or different from the liquid supplying speed. Furthermore, when the upper gas valve 57 is closed, the upper gas valve 57 is opened to cause the central nozzle 55 to start to discharge the nitrogen gas. In addition to or in place of opening the upper gas valve 57, the opening degree of the flow rate adjusting valve 65 may be changed to thereby increase the flow rate of the nitrogen gas discharged from the upper central opening 61 of the shielding member 51. When a predetermined time has elapsed after the substrate W starts to rotate at the sublimating speed, the spin motor 14 is stopped and the rotation of the substrate W is stopped (step S10 in FIG. 5).

For example, when the substrate W starts to rotate at the sublimating speed, the solidified body 101 on the substrate W starts to sublimate, so that a gas containing a sublimable substance is generated from the solidified body 101 on the substrate W. The gas generated from the solidified body 101 (a gas containing the sublimable substance) radially flows through the space between the substrate W and the shielding member 51 and is discharged upwardly from the substrate W. Then, after a certain time has elapsed after the sublimating started, all the solidified body 101 is removed from the substrate W as shown in FIG. 6C.

Next, a carry-out step (step S11 in FIG. 5) is performed to carry the substrate W out of the chamber 4.

Specifically, the shielding member elevating/lowering unit 54 elevates the shielding member 51 to the upper position, and the guard elevating/lowering unit 27 lowers all the guards 24 to the lower position. Furthermore, the upper gas valve 64 and the lower gas valve 84 are closed, so that the upper central opening 61 of the shielding member 51 and the lower central opening 81 of the spin base 12 stop discharging the nitrogen gas. Thereafter, the center robot CR causes the hand H1 to enter the chamber 4. After the plurality of chuck pins 11 release the gripping of the substrate W, the center robot CR supports the substrate W on the spin chuck 10 with the hand H1. Thereafter, while supporting the substrate W with the hand H1, the center robot CR retracts the hand H1 out of the chamber 4. This allows the processed substrate W to be carried out of the chamber 4.

Figure 7:
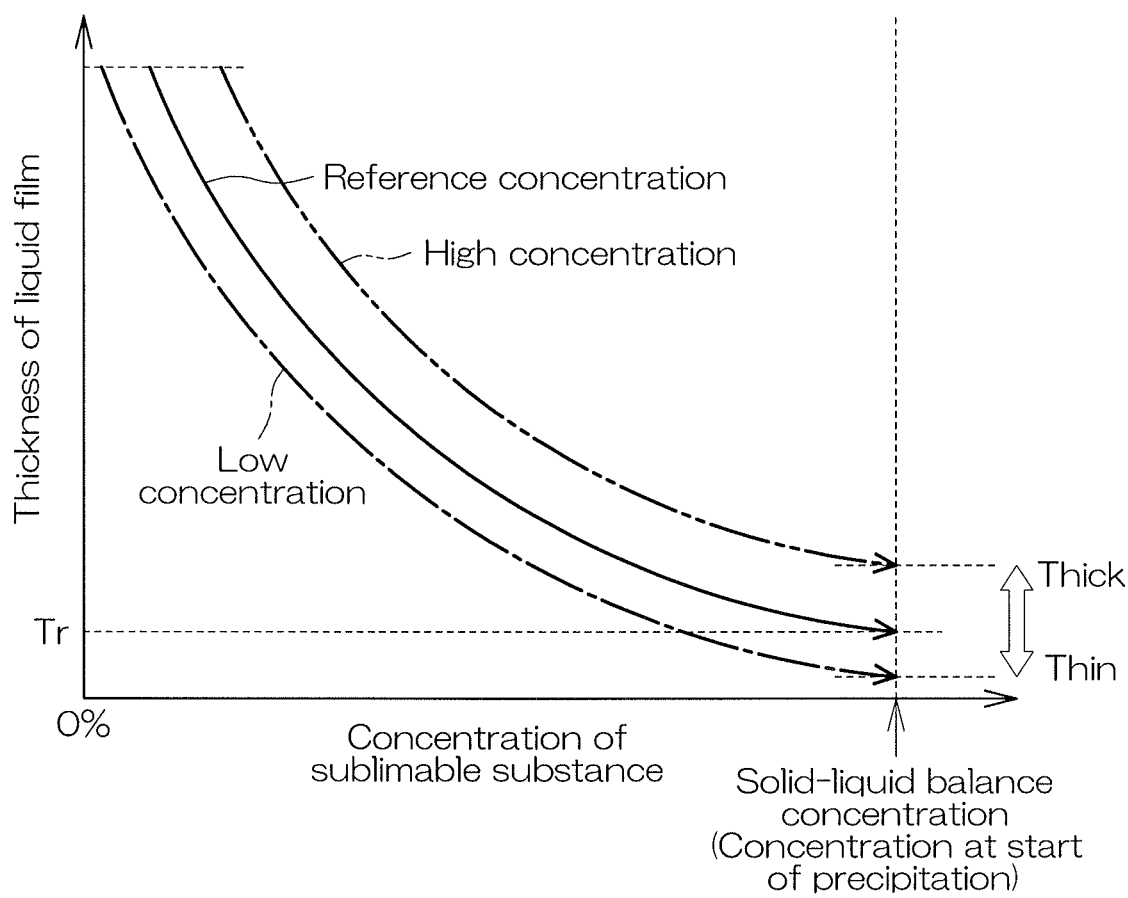
FIG. 7 is a graph showing an example image in which a solvent is evaporated to thereby reduce the thickness of the liquid film of the pre-drying processing liquid on the substrate.

FIG. 7 is a graph showing an example of an image in which the liquid film of the pre-drying processing liquid on the substrate W is reduced in thickness by evaporating the solvent.

FIG. 7 employs a solid line to show the thickness of a liquid film when the initial concentration of the sublimable substance is equal to a reference concentration, an alternate long and short dashed line to show the thickness of a liquid film when the initial concentration of the sublimable substance is equal to a low concentration, and an alternate long and two short dashed line to show the thickness of a liquid film when the initial concentration of the sublimable substance is equal to a high concentration. The reference concentration is higher than the low concentration and lower than the high concentration. The initial concentration of the sublimable substance refers to the concentration of the sublimable substance in the pre-drying processing liquid before being supplied to the substrate W.

If the concentration of the sublimable substance in the pre-drying processing liquid is the same, a thickness T1 of the solidified body 101 to be formed on the substrate W (see FIG. 6B) depends on the film thickness of the pre-drying processing liquid (the thickness of the liquid film) before the solidified body 101 is formed. That is, a greater film thickness of the pre-drying processing liquid results in the solidified body 101 of a greater thickness being formed, whereas a smaller film thickness of the pre-drying processing liquid results in the solidified body 101 of a reduced thickness being formed. Therefore, by changing the film thickness of the pre-drying processing liquid, the thickness T1 of the solidified body 101 can be changed.

When the rotational speed of the substrate W increases, the pre-drying processing liquid is discharged from the substrate W due to centrifugal force, so that the film thickness of the pre-drying processing liquid on the substrate W is reduced. At this time, if a gas is discharged toward the upper surface of the substrate W, the pressure of the gas applies to the pre-drying processing liquid and thus the film thickness of the pre-drying processing liquid on the substrate W is further reduced. However, when the film thickness is reduced to a certain extent, since the flow rate within the liquid film will be extremely lowered, even if the rotational speed and the flow rate of the gas is increased, the film thickness will not be greatly varied. Conversely, excessively increasing the rotational speed or the flow rate of the gas would cause the upper surface of the substrate W to be partially exposed from the liquid film.

Therefore, the film thickness of the pre-drying processing liquid before the solidified body 101 is formed cannot be extremely thinned even if the rotational speed of the substrate W or the flow rate of the gas is changed, so that an extremely thin solidified body 101 cannot be formed. Therefore, to form an extremely thin solidified body 101 covering the entire upper surface of the substrate W (e.g., a solidified body 101 greater in thickness than zero and 1 μm or less) or change the thickness T1 of the solidified body 101 within an extremely thin range (e.g., a range greater than zero and 1 μm or less), the initial concentration of the sublimable substance has to be changed.

In FIG. 7, the film thickness of the pre-drying processing liquid before the solvent is evaporated is constant regardless of the initial concentration of the sublimable substance. Furthermore, as shown in FIG. 7, if the pre-drying processing liquids are at an equal temperature, the concentration of the sublimable substance when the solidified body 101 starts to precipitate is constant regardless of the initial concentration of the sublimable substance. Evaporating the solvent to form the solidified body 101 will cause the film thickness of the pre-drying processing liquid to be gradually reduced with increasing concentrations of the sublimable substance gradually. The freezing point of the pre-drying processing liquid increases as the concentration of the sublimable substance increases. When the freezing point of the pre-drying processing liquid reaches the temperature of the pre-drying processing liquid, the pre-drying processing liquid starts to solidify, so that the solidified body 101 is formed on the substrate W.

As shown in FIG. 7, when the initial concentration of the sublimable substance is the reference concentration, the solidified body 101 of a reference thickness Tr is formed. Since the pre-drying processing liquid contains a small amount of sublimable substance when the initial concentration of the sublimable substance is a low concentration, a solidified body 101 that is thinner than the reference thickness Tr is formed. Since the pre-drying processing liquid contains a greater amount of sublimable substance when the initial concentration of the sublimable substance is at a high concentration, a solidified body 101 that is thicker than the reference thickness Tr is formed. Therefore, by controlling the initial concentration of the sublimable substance, the thickness T1 of the solidified body 101 can be varied within the extremely thin range.

Figure 8:
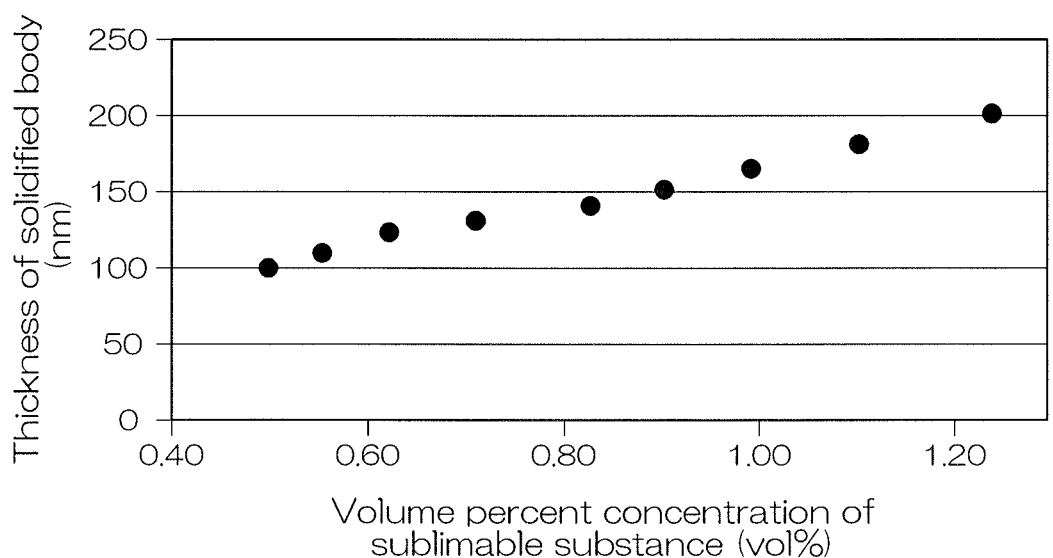
FIG. 8 is a graph showing an example of the relationship between the initial concentration of a sublimable substance and the thickness of a solidified body.

FIG. 8 is a graph showing an example of the relationship between the initial concentration of sublimable substance and the thickness T1 of the solidified body 101. The vol % in FIG. 8 refers to the volume percent concentration. When the pre-drying processing liquid changes to the solidified body 101, the color of the substance on the substrate W changes from transparent to non-transparent. If a non-transparent solidified body 101 is formed when the film thickness of a transparent pre-drying processing liquid is measured by the spectral interference, measurement values will be varied. Values immediately before the variation are shown in FIG. 8 as the thickness T1 of the solidified body 101.

In FIG. 8, the thickness T1 of the solidified body 101 was approximately 100 μm when the initial concentration of the sublimable substance was 0.5 vol %, and the thickness T1 of the solidified body 101 was approximately 200 μm when the initial concentration of the sublimable substance was 1.23 vol % The initial concentration of the sublimable substance and the thickness T1 of the solidified body 101 have a generally directly proportional relationship, so that the thickness T1 of the solidified body 101 increases at a constant rate as the initial concentration of the sublimable substance increases. Therefore, by changing the initial concentration of the sublimable substance, the thickness T1 of the solidified body 101 can be varied within an extremely thin range.

Figure 10:
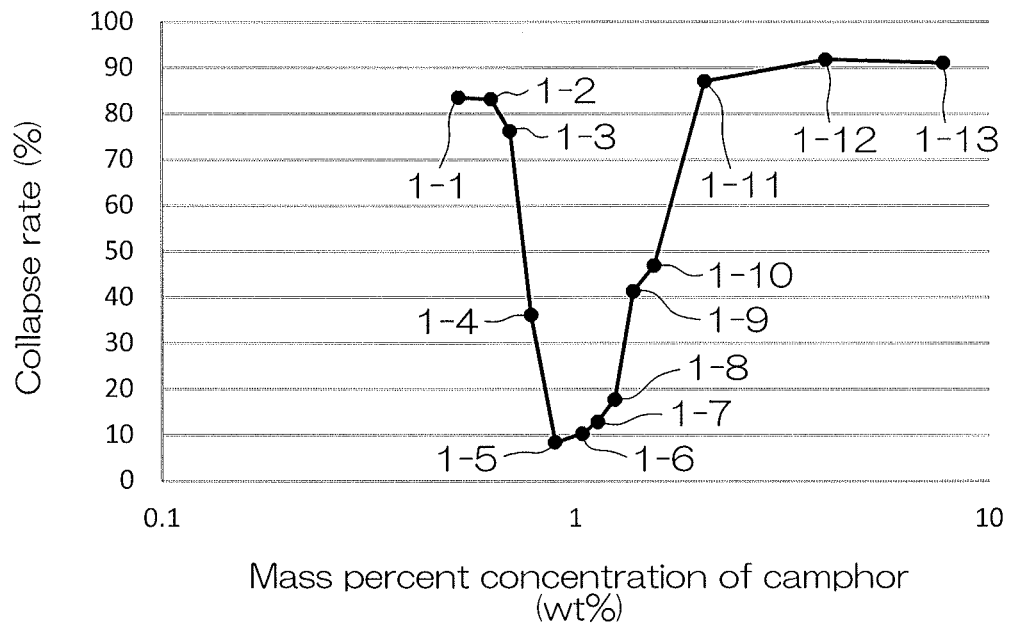
FIG. 10 is a line graph showing the relationship between the concentration of camphor and the pattern collapse rate in FIG. 9.

FIG. 9 is a table showing an example of the embedding rate and the collapse rate of a pattern P1 that were acquired when a plurality of samples, on which patterns P1 having similar shapes and strengths had been formed, are processed while the initial concentration of camphor was being changed. FIG. 10 is a line graph showing the relationship between the concentration of camphor and the collapse rate of the pattern P1 in FIG. 9.

FIG. 9 and FIG. 10 show the collapse rate of the pattern P1 when the sublimable substance is camphor, and the solvent is IPA. Among the measurement condition 1-1 to measurement condition 1-13 shown in FIG. 9 and FIG. 10, the conditions other than the initial concentration of camphor are the same. The wt % in FIG. 9 shows the mass percent concentration. The same applies to other figures such as FIG. 14.

The collapse rate of the pattern P1 is acquired by multiplying a ratio of the number of collapsed patterns P1 to the total number of patterns P1 by 100. The embedding rate is acquired by multiplying a ratio of the thickness T1 of the solidified body 101 (see FIG. 6B) to a height Hp of the pattern P1 (see FIG. 6B) by 100. That is, the embedding rate is determined by the calculation equation, ((the thickness T1 of the solidified body 101/the height Hp of the pattern P1)×100).

As shown for measurement condition 1-1 in FIG. 9, when the initial concentration of camphor was 0.52 wt %, the collapse rate of the pattern P1 was 83.5%.

As shown for measurement condition 1-2 in FIG. 9, when the initial concentration of camphor was 0.62 wt %, the collapse rate of the pattern P1 was 83.1%.

As shown for measurement condition 1-3 in FIG. 9, when the initial concentration of camphor was 0.69 wt %, the collapse rate of the pattern P1 was 76.2%.

As shown for measurement condition 1-4 in FIG. 9, when the initial concentration of camphor was 0.78 wt %, the collapse rate of the pattern P1 was 36.1%.

As shown for measurement condition 1-13 in FIG. 9, when the initial concentration of camphor was 7.76 wt %, the collapse rate of the pattern P1 was 91.0%.

As shown for measurement condition 1-12 in FIG. 9, when the initial concentration of camphor was 4.03 wt %, the collapse rate of the pattern P1 was 91.7%.

As shown for measurement condition 1-11 in FIG. 9, when the initial concentration of camphor was 2.06 wt %, the collapse rate of the pattern P1 was 87.0%.

As shown for measurement condition 1-10 in FIG. 9, when the initial concentration of camphor was 1.55 wt %, the collapse rate of the pattern P1 was 46.8%.

As can be seen from FIG. 9 and FIG. 10, when the initial concentration of camphor increases from 0.62 wt % to 0.69 wt %, the collapse rate of the pattern P1 decreases (measurement condition 1-2 to measurement condition 1-3). In addition, when the initial concentration of camphor increases from 0.69 wt % to 0.78 wt %, the collapse rate of the pattern P1 abruptly decreases (measurement condition 1-3 to measurement condition 1-4).

Meanwhile, when the initial concentration of camphor decreases from 2.06 wt % to 1.55 wt %, the collapse rate of the pattern P1 abruptly decreases (measurement condition 1-11 to measurement condition 1-10).

Therefore, the initial concentration of camphor is preferably greater than 0.62 wt % and less than 2.06 wt %, more preferably 0.78 wt % or greater and less than 2.06 wt %.

Within the range of the initial concentration of camphor being greater than 0.62 wt % and less than 2.06 wt %, the collapse rate of the pattern P1 is less than 87.0%.

Within the range of the initial concentration of camphor being 0.78 wt % or greater and 1.55 wt % or less, the collapse rate of the pattern P1 is 46.8% or less.

Within the range of the initial concentration of camphor being 0.89 wt % or greater and 1.24 wt % or less, the collapse rate of the pattern P1 is 17.6% or less. The collapse rate of the pattern P1 was 8.32%, that is, the smallest when the initial concentration of camphor was 0.89 wt %.

Therefore, the initial concentration of camphor may be 0.78 wt % or greater and 1.55 wt % or less, or may also be 0.89 wt % or greater and 1.24 wt % or less.

Figure 11:
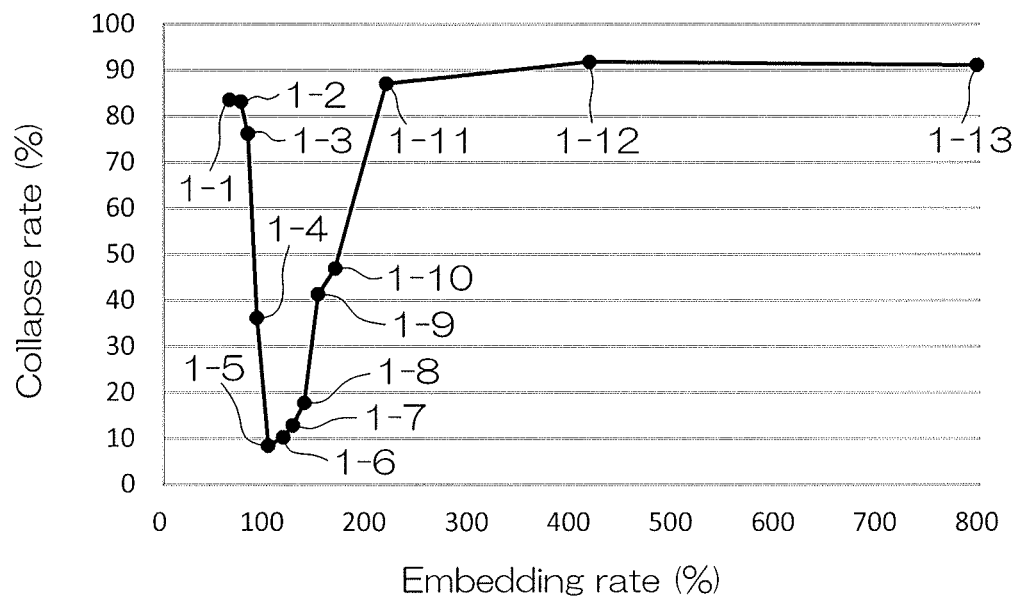
FIG. 11 is a line graph showing the relationship between the embedding rate and the pattern collapse rate in FIG. 9.

FIG. 11 is a line graph showing the relationship between the embedding rate and the collapse rate of the pattern P1 in FIG. 9.

As shown for measurement condition 1-1 in FIG. 9, when the embedding rate was 65%, the collapse rate of the pattern P1 was 83.5%.

As shown for measurement condition 1-2 in FIG. 9, when the embedding rate was 76%, the collapse rate of the pattern P1 was 83.1%.

As shown for measurement condition 1-3 in FIG. 9, when the embedding rate was 83%, the collapse rate of the pattern P1 was 76.2%.

As shown for measurement condition 1-4 in FIG. 9, when the embedding rate was 91%, the collapse rate of the pattern P1 was 36.1%.

As shown for measurement condition 1-13 in FIG. 9, when the embedding rate was 797%, the collapse rate of the pattern P1 was 91.0%.

As shown for measurement condition 1-12 in FIG. 9, when the embedding rate was 418%, the collapse rate of the pattern P1 was 91.7%.

As shown for measurement condition 1-11 in FIG. 9, when the embedding rate was 219%, the collapse rate of the pattern P1 was 87.0%.

As shown for measurement condition 1-10 in FIG. 9, when the embedding rate was 168%, the collapse rate of the pattern P1 was 46.8%.

As can be seen from FIG. 9 and FIG. 11, when the embedding rate increases from 76% to 83%, the collapse rate of the pattern P1 decreases (measurement condition 1-2 to measurement condition 1-3). In addition, when the embedding rate increases from 83% to 91%, the collapse rate of the pattern P1 abruptly decreases (measurement condition 1-3 to measurement condition 1-4).

Meanwhile, when the embedding rate decreases from 219% to 168%, the collapse rate of the pattern P1 abruptly decreases (measurement condition 1-11 to measurement condition 1-10).

Therefore, the embedding rate is preferably greater than 76% and less than 219%, more preferably 83% or greater and less than 219%.

Within the range of the embedding rate being greater than 76% and less than 219%, the collapse rate of the pattern P1 is less than 87.0%.

Within the range of the embedding rate being 91% or greater and 168% or less, the collapse rate of the pattern P1 is 46.8% or less.

Within the range of the embedding rate being 102% or greater and 138% or less, the collapse rate of the pattern P1 is 17.6% or less. The collapse rate of the pattern P1 was 8.32%, that is, the smallest when the embedding rate was 102%.

Therefore, the embedding rate may be 91% or greater and 168% or less and may also be 102% or greater and 138% or less.

As described above, the initial concentration of camphor is preferably greater than 0.62 wt % and less than 2.06 wt %. As shown in FIG. 9, when the initial concentration of camphor is 0.62 wt %, the embedding rate is 76%. When the initial concentration of camphor is 2.06 wt %, the embedding rate is 219%. Therefore, in the example, setting the initial concentration of camphor to a value within a preferable range will result in the embedding rate being automatically set to a value within a preferable range.

FIG. 12A and FIG. 12B are schematic views for describing a possible mechanism for a phenomenon that an excessively thick solidified body 101 will lead to a higher collapse rate of the pattern P1. FIG. 13A and FIG. 13B are schematic views for describing a possible mechanism for a phenomenon that an excessively thin solidified body 101 will lead to a higher collapse rate of the pattern P1.

As shown in FIG. 11, an excessively thick solidified body 101 (an excessively high embedding rate) will lead to a higher collapse rate of the pattern P1. Additionally, although the collapse rate of the pattern P1 may be low in some cases even when the thickness T1 of the solidified body 101 is less than the height Hp of the pattern P1, an excessively thin solidified body 101 (an excessively low embedding rate) will lead to a higher collapse rate of the pattern P1. Hereinafter, description will be made for a possible mechanism for these phenomena.

First, description will be made for a possible mechanism for a phenomenon that an excessively thick solidified body 101 will lead to a higher collapse rate of the pattern P1.

As the evaporation of IPA contained in the pre-drying processing liquid proceeds, the concentration of camphor in the pre-drying processing liquid gradually increases, so that the freezing point of the pre-drying processing liquid gradually increases. When the freezing point of the pre-drying processing liquid reaches the temperature of the pre-drying processing liquid, the pre-drying processing liquid starts to solidify, so that the solidified body 101 containing camphor is formed on the substrate W.

When the embedding rate is 100% or greater, that is, when the thickness T1 of the solidified body 101 (see FIG. 6B) is equal to or greater than the height Hp of the pattern P1 (see FIG. 6B), the pre-drying processing liquid is found not only between patterns P1 but also above the patterns P1 before the solidified body 101 is formed. For the substrate W such as a semiconductor wafer, since adjacent two projected patterns P1 have a narrow spacing, the freezing point of the pre-drying processing liquid located between the patterns P1 is lowered. Therefore, the freezing point of the pre-drying processing liquid located between the patterns P1 is lower than the freezing point of the pre-drying processing liquid located above the patterns P1.

When the freezing point of the pre-drying processing liquid located above the patterns P1 is higher than the freezing point of the pre-drying processing liquid located between the patterns P1, the pre-drying processing liquid starts to solidify at a position other than between the patterns P1. Specifically, as shown in FIG. 12A, the crystal nucleus of camphor is generated in the surface layer of the pre-drying processing liquid, that is, in a liquid layer located within the range from the upper surface of the pre-drying processing liquid (fluid surface) to the upper surface of the pattern P1, so that the crystal nucleus gradually grows. Then, when a certain time has elapsed, the entire surface layer of the pre-drying processing liquid is solidified into a solidified body 101.

When the freezing point of the pre-drying processing liquid located between the patterns P1 is lower than the freezing point of the pre-drying processing liquid located above the patterns P1, as shown in FIG. 12B, the pre-drying processing liquid located between the patterns P1 may not be solidified but remains unchanged in the state of liquid. In this case, an interface between a solid (the solidified body 101) and a liquid (the pre-drying processing liquid) is formed in the vicinity of the pattern P1. FIG. 12B shows the state of an unclear interface between solid and liquid that is located between the patterns P1.

Solid and liquid have mutually different surface free energies. When an unclear interface between a solid (the solidified body 101) and a liquid (the pre-drying processing liquid) is located between the patterns P1, a force caused by Laplace pressure is applied to the patterns P1. At this time, the force applied to the patterns P1 increases as the solidified body 101 becomes thicker. Therefore, when the solidified body 101 is excessively thick, a collapsing force to collapse the patterns P1 would exceed the strength of the patterns P1, so that the collapse rate of the pattern P1 becomes higher. It is thought that such a mechanism raises the collapse rate of the pattern P1.

Next, description will be made for a possible mechanism for a phenomenon that the collapse rate of the pattern P1 becomes lower even for an embedding rate of less than 100%.

When the solidified body 101 is formed, the upper surface (fluid surface) of the pre-drying processing liquid gradually approaches the lower end of the pattern P1 as the evaporation of IPA proceeds. When the thickness T1 of the solidified body 101 is significantly less than the height Hp of the pattern P1, as shown in FIG. 13A, the upper surface of the pre-drying processing liquid moves to between two adjacent projected patterns P1 before the entire pre-drying processing liquid is solidified. That is, an interface between a gas and a liquid (the pre-drying processing liquid) moves to between the patterns P1. For that reason, it is thought that a force caused by the surface tension of the pre-drying processing liquid is applied to the patterns P1, and thus the pattern P1 is collapsed. Then, as shown in FIG. 13B, it is thought that the solidified body 101 is formed with the pattern P1 collapsed.

It is also thought that the interface between gas and liquid may move to between the patterns P1 when the thickness T1 of the solidified body 101 is slightly less than the height Hp of the pattern P1. However, in this case, it is thought that the crystal nucleus of camphor has already been formed between the patterns P1, and the crystal nucleus has grown to a certain extent. In this case, the gradient of the pattern P1 is restricted by a large crystal nucleus, and thus the patterns P1 are unlikely to collapse. It is thought that such a mechanism would lower the collapse rate of the pattern P1 even when the thickness T1 of the solidified body 101 is somewhat less than the height Hp of the pattern P1.

As described above, an excessively thin or thick solidified body 101 would lower the collapse rate of the pattern P1. In other words, to lower the collapse rate of the pattern P1 of the substrate W after having been dried, the thickness of the solidified body 101 has an appropriate range. For example, by setting the solidified body 101 to a value within the range that was described referring to FIG. 9, the collapse rate of the pattern P1 of the substrate W after having been dried can be lowered. This allows the substrate W to be dried while reducing the collapse rate of the pattern P1.

Next, description will be made to measurement results acquired on other samples.

FIG. 14 to FIG. 16 are a table showing an example of the collapse rates of patterns P1 that were acquired when a plurality of samples, on which patterns P1 having similar shapes and strengths had been formed, were processed while the initial concentration of camphor was being changed.

FIG. 14 shows the collapse rate of the pattern P1 when the sublimable substance is camphor and the solvent is IPA. FIG. 15 shows the collapse rate of the pattern P1 when the sublimable substance is camphor and the solvent is acetone. FIG. 16 shows the collapse rate of the pattern P1 when the sublimable substance is camphor and the solvent is PGEE.

Among measurement condition 2-1 to measurement condition 2-5 shown in FIG. 14, the conditions other than the initial concentration of camphor are the same. Likewise, among measurement condition 3-1 to measurement condition 3-13 shown in FIG. 15, the conditions other than the initial concentration of camphor are the same. Further, among measurement condition 4-1 to measurement condition 4-8 shown in FIG. 16, the conditions other than the initial concentration of camphor are the same.

For the measurements in FIG. 14 to FIG. 16, similar samples were employed. The strengths of the patterns P1 of the samples used for the measurements in FIG. 14 to FIG. 16 are different from the strengths of the patterns P1 of the samples used for the measurements in FIG. 9. Therefore, although FIG. 9 and FIG. 14 both show the collapse rate of the pattern P1 when the sublimable substance is camphor and the solvent is IPA, the collapse rates shown in FIG. 9 and FIG. 14 cannot be simply compared with each other because the strengths of the patterns P1 used for the measurements are different.

Figure 17:
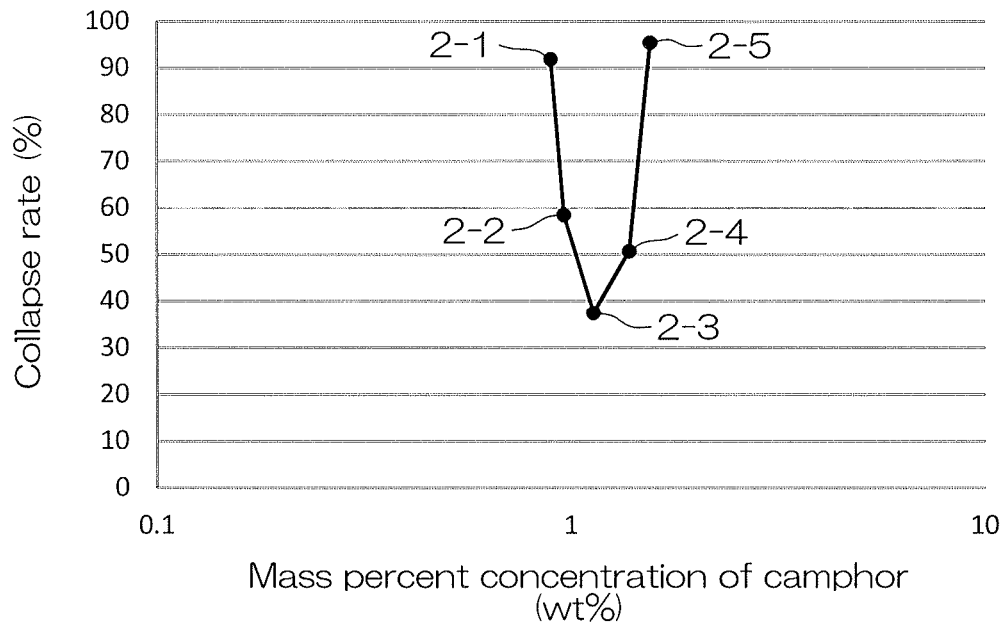
FIG. 17 is a line graph showing the relationship between the concentration of camphor and the pattern collapse rate in FIG. 14.
Figure 18:
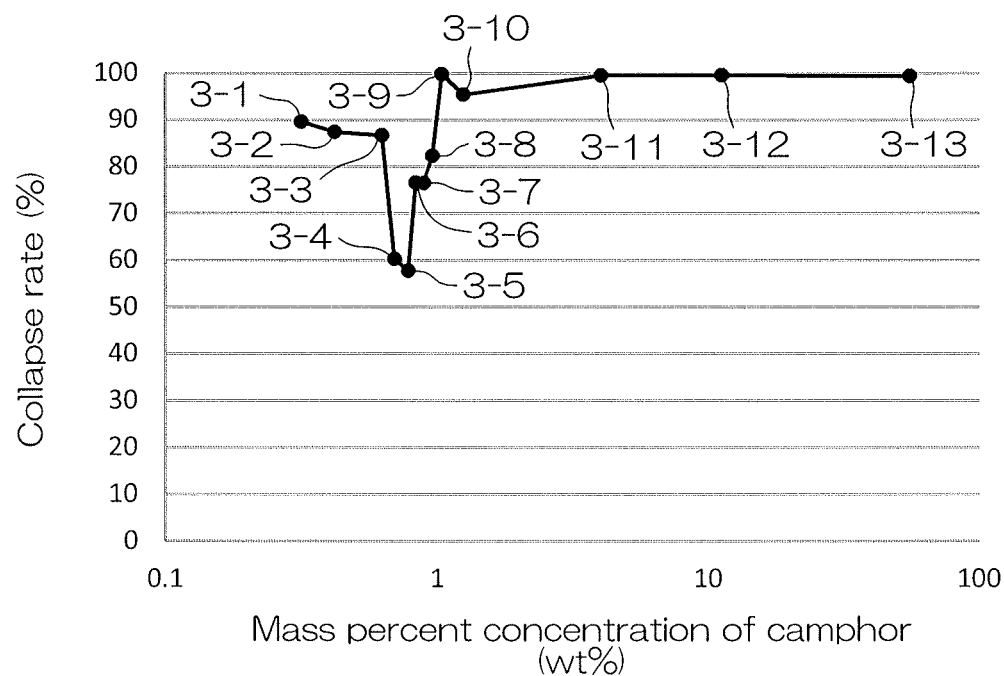
FIG. 18 is a line graph showing the relationship between the concentration of camphor and the pattern collapse rate in FIG. 15.
Figure 19:
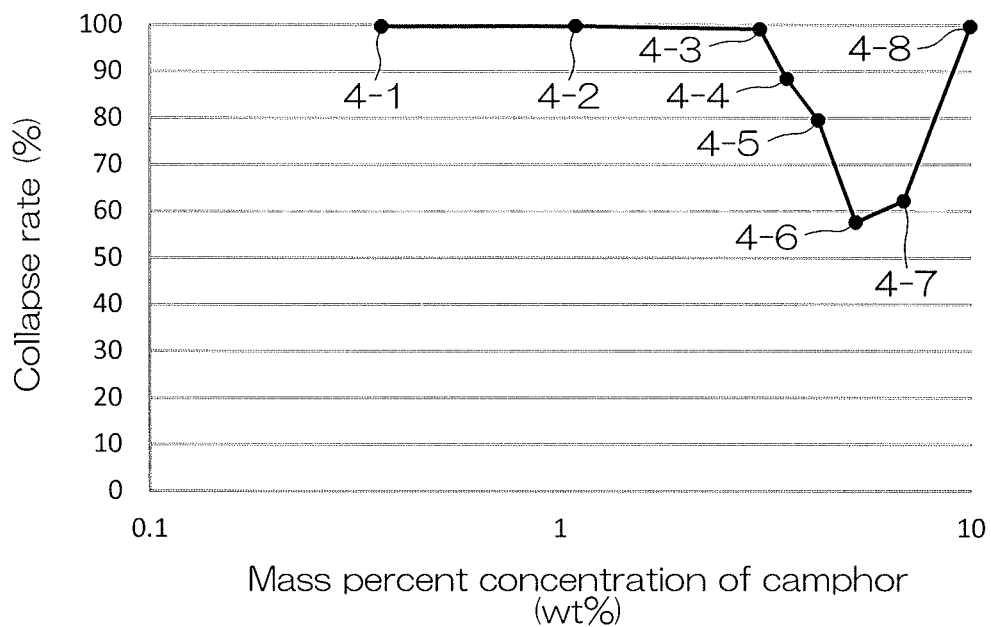
FIG. 19 is a line graph showing the relationship between the concentration of camphor and the pattern collapse rate in FIG. 16.

FIG. 17 is a line graph showing the relationship between the concentration of camphor and the collapse rate of the pattern P1 in FIG. 14. FIG. 18 is a line graph showing the relationship between the concentration of camphor and the collapse rate of the pattern P1 in FIG. 15. FIG. 19 is a line graph showing the relationship between the concentration of camphor and the collapse rate of the pattern P1 in FIG. 16.

First, referring to FIG. 14 and FIG. 17, description will be made for an example of the relationship between the initial concentration of camphor and the collapse rate of the pattern P1 when the solvent is IPA.

As shown for measurement condition 2-1 in FIG. 14, when the initial concentration of camphor was 0.89 wt %, the collapse rate of the pattern P1 was 91.7%.

As shown for measurement condition 2-2 in FIG. 14, when the initial concentration of camphor was 0.96 wt %, the collapse rate of the pattern P1 was 58.4%.

As shown for measurement condition 2-3 in FIG. 14, when the initial concentration of camphor was 1.13 wt %, the collapse rate of the pattern P1 was 37.3.

As shown for measurement condition 2-4 in FIG. 14, when the initial concentration of camphor was 1.38 wt %, the collapse rate of the pattern P1 was 50.6%.

As shown for measurement condition 2-5 in FIG. 14, when the initial concentration of camphor was 1.55 wt %, the collapse rate of the pattern P1 was 95.3%.

As can be seen from FIG. 14 and FIG. 17, when the initial concentration of camphor increases from 0.89 wt % to 0.96 wt %, the collapse rate of the pattern P1 abruptly decreases (measurement condition 2-1 to measurement condition 2-2). When the initial concentration of camphor decreases from 1.55 wt % to 1.38 wt %, the collapse rate of the pattern P1 also abruptly decreases (measurement condition 2-5 to measurement condition 2-4).

Within the range of the initial concentration of camphor being 0.96 wt % or greater and 1.38 wt % or less, the collapse rate of the pattern P1 is 58.4% or less. Therefore, when the solvent is IPA, the initial concentration of camphor is preferably greater than 0.89 wt % and less than 1.55 wt %, more preferably 0.96 wt % or greater and 1.38 wt % or less.

Next, referring to FIG. 15 and FIG. 18, description will be made for an example of the relationship between the initial concentration of camphor and the collapse rate of the pattern P1 when the solvent is acetone.

As shown for measurement condition 3-3 in FIG. 15, when the initial concentration of camphor was 0.62 wt %, the collapse rate of the pattern P1 was 86.6%.

As shown for measurement condition 3-4 in FIG. 15, when the initial concentration of camphor was 0.69 wt %, the collapse rate of the pattern P1 was 60.2%.

As shown for measurement condition 3-9 in FIG. 15, when the initial concentration of camphor was 1.04 wt %, the collapse rate of the pattern P1 was 99.7%.

As shown for measurement condition 3-8 in FIG. 15, when the initial concentration of camphor was 0.96 wt %, the collapse rate of the pattern P1 was 82.2%.

As shown for measurement condition 3-7 in FIG. 15, when the initial concentration of camphor was 0.89 wt %, the collapse rate of the pattern P1 was 76.4%.

As can be seen from FIG. 15 and FIG. 18, when the initial concentration of camphor increases from 0.62 wt % to 0.69 wt %, the collapse rate of the pattern P1 abruptly decreases (measurement condition 3-3 to measurement condition 3-4). When the initial concentration of camphor decreases from 1.04 wt % to 0.96 wt %, the collapse rate of the pattern P1 also abruptly decreases (measurement condition 3-9 to measurement condition 3-8).

However, within the range of the initial concentration of camphor being 0.96 wt % or greater and 1.04 wt % or less, the collapse rate of the pattern P1 is not too low. When the initial concentration of camphor decreases from 0.96 wt % to 0.89 wt % (measurement condition 3-8 to measurement condition 3-7), the collapse rate of the pattern P1 abruptly decreases, and further the collapse rate of the pattern P1 is comparatively low. Therefore, when the solvent is acetone, the initial concentration of camphor is preferably greater than 0.62 wt % and 0.96 wt % or less.

Next, referring to FIG. 16 and FIG. 19, description will be made for an example of the relationship between the initial concentration of camphor and the collapse rate of the pattern P1 when the solvent is PGEE.

As shown for measurement condition 4-3 in FIG. 16, when the initial concentration of camphor was 3.06 wt %, the collapse rate of the pattern P1 was 98.9%.

As shown for measurement condition 4-4 in FIG. 16, when the initial concentration of camphor was 3.55 wt %, the collapse rate of the pattern P1 was 88.3%.

As shown for measurement condition 4-5 in FIG. 16, when the initial concentration of camphor was 4.23 wt %, the collapse rate of the pattern P1 was 79.4%.

As shown for measurement condition 4-8 in FIG. 16, when the initial concentration of camphor was 9.95 wt %, the collapse rate of the pattern P1 was 99.5%.

As shown for measurement condition 4-7 in FIG. 16, when the initial concentration of camphor was 6.86 wt %, the collapse rate of the pattern P1 was 62.1%.

As shown for measurement condition 4-6 in FIG. 16, when the initial concentration of camphor was 5.23 wt %, the collapse rate of the pattern P1 was 57.5%.

As can be seen from FIG. 15 and FIG. 18, when the initial concentration of camphor increases from 3.06 wt % to 3.55 wt % (measurement condition 4-3 to measurement condition 4-4), the collapse rate of the pattern P1 abruptly decreases, however, within the range, the collapse rate of the pattern P1 is not too low. When the initial concentration of camphor increases from 3.55 wt % to 4.23 wt % (measurement condition 4-4 to measurement condition 4-5), the collapse rate of the pattern P1 abruptly decreases, and further the collapse rate of the pattern P1 is comparatively low.

Additionally, when the initial concentration of camphor decreases from 9.95 wt % to 6.86 wt % (measurement condition 4-8 to measurement condition 4-7), the collapse rate of the pattern P1 abruptly decreases, however, within the range, included is such a case where the collapse rate of the pattern P1 is not too low. That is, the collapse rate of the pattern P1 is low when the initial concentration of camphor is near 6.86 wt %, however, the collapse rate of the pattern P1 is high when the initial concentration of camphor is near 9.95 wt %.

When the initial concentration of camphor decreases from 6.86 wt % to 5.23 wt % (measurement condition 4-7 to measurement condition 4-6), the collapse rate of the pattern P1 gradually decreases. Therefore, when the solvent is PGEE, the initial concentration of camphor is preferably greater than 3.55 wt % and 6.86 wt % or less.

Figure 20:
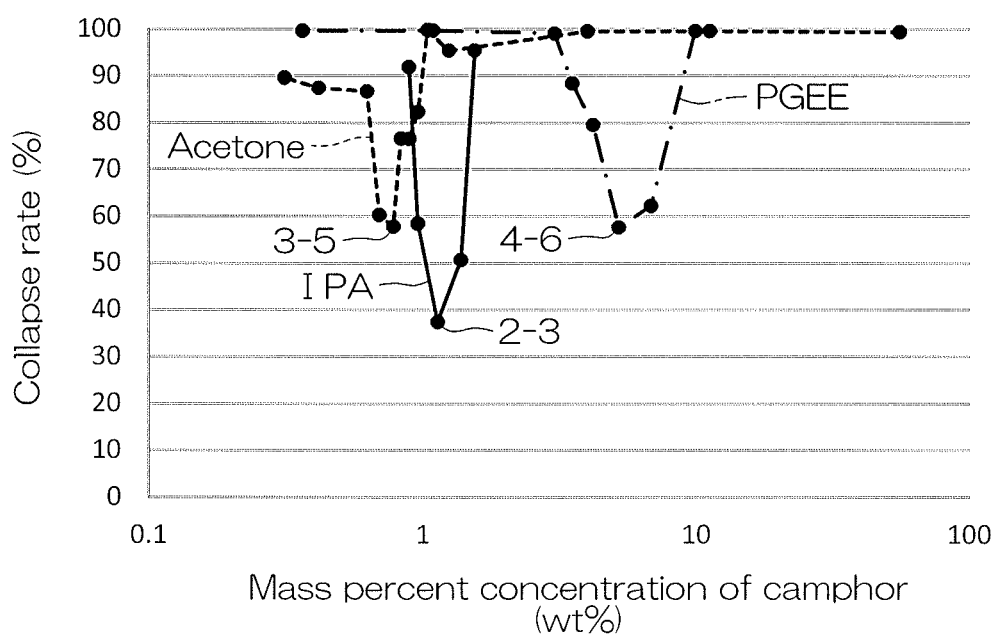
FIG. 20 is a graph by overlapping the lines of FIG. 17 to FIG. 19.

FIG. 20 is a graph acquired by overlapping the lines of FIG. 17 to FIG. 19. In FIG. 20, the lines of FIG. 17 (IPA) are shown in solid lines, the lines of FIG. 18 (acetone) are shown in broken lines, and the lines of FIG. 19 (PGEE) are shown in alternate long and short dashed lines.

When the solvent was IPA and the initial concentration of camphor was 1.13 wt %, the collapse rate of the pattern P1 was 37.3%, that is, the smallest (measurement condition 2-3).

When the solvent was acetone and the initial concentration of camphor was 0.78 wt %, the collapse rate of the pattern P1 was 57.6%, that is, the smallest (measurement condition 3-5).

When the solvent was PGEE and the initial concentration of camphor was 5.23 wt %, the collapse rate of the pattern P1 was 57.5%, that is, the smallest (measurement condition 4-6).

In other words, the initial concentration of camphor at the lowest collapse rate of the pattern P1 was as follows: 0.78 wt % when the solvent was acetone; 1.13 wt % when the solvent was IP; and 5.23 wt % when the solvent was PGEE. In a comparison in which attention is focused on these solvents, the initial concentration of camphor at the lowest collapse rate of the pattern P1 increases as the vapor pressure of the solvent decreases. That is, if the solvent easily evaporates, the concentration of the sublimable substance contained in the pre-drying processing liquid is not always required to increase. Conversely, if the solvent does not easily evaporate, the concentration of the sublimable substance contained in the pre-drying processing liquid is required to increase.

The present invention makes it necessary to evaporate the solvent from the pre-drying processing liquid and thereby form the solidified body 101 containing the sublimable substance on the front surface of the substrate W. Thus, for example, a step of selecting a solvent depending on the vapor pressure of the sublimable substance may be performed.

As described above, according to the measurement results of FIG. 9, setting the initial concentration of camphor to a value within a preferable range will result in the embedding rate being automatically set to a value within a preferable range. Therefore, for the measurements of FIG. 14 to FIG. 16, it is thought that setting the initial concentration of camphor to a value within the preferable range will result in the embedding rate being automatically set to a value within the preferable range. It is thought that this lowers the collapse rate of the pattern P1.

However, it is thought that setting the initial concentration of camphor to a value within the preferable range would not always result in the embedding rate being set to a value within the preferable range depending on the shape or strength of the pattern P1. Likewise, it is also thought that setting the embedding rate to a value within the preferable range would not always result in the initial concentration of camphor being set to a value within the preferable range depending on the shape or strength of the pattern P1.

As described above, in the first preferred embodiment, the pre-drying processing liquid that contains the sublimable substance, which corresponds to a solute, and the solvent is supplied to the front surface of the substrate W on which the pattern P1 has been formed. Thereafter, the solvent is evaporated from the pre-drying processing liquid. This allows the solidified body 101 containing the sublimable substance to be formed on the front surface of the substrate W. Thereafter, the solidified body 101 on the substrate W is changed to gas without passing through to a liquid. This allows the solidified body 101 to be removed from the front surface of the substrate W. Therefore, the collapse rate of the pattern P1 can be lowered as compared with a conventional drying method such as the spin dry.

Evaporating the solvent from the pre-drying processing liquid will cause the solidified body 101 containing the sublimable substance to be formed on the front surface of the substrate W. The embedding rate when the solidified body 101 is formed is greater than 76 and less than 219. As described above, with the embedding rate being out of the range, the number of collapsed patterns P1 would increase depending on the strength of the pattern P1. Conversely, when the embedding rate is within the range, the number of collapsed patterns P1 can be reduced even when the strength of the pattern P1 is low. Therefore, even when the strength of the pattern P1 is low, the collapse rate of the pattern P1 can be lowered.

Next, description will be made below for a second preferred embodiment.

The second preferred embodiment is different from the first preferred embodiment mainly in that in addition to the sublimable substance and the solvent, an adsorbent substance is contained in the pre-drying processing liquid.

In FIG. 21 to FIG. 23F below, the same components as those shown in FIG. 1 to FIG. 20 will be given the same reference symbols as those of FIG. 1 and so on, and will not be explained repeatedly.

Figure 21:
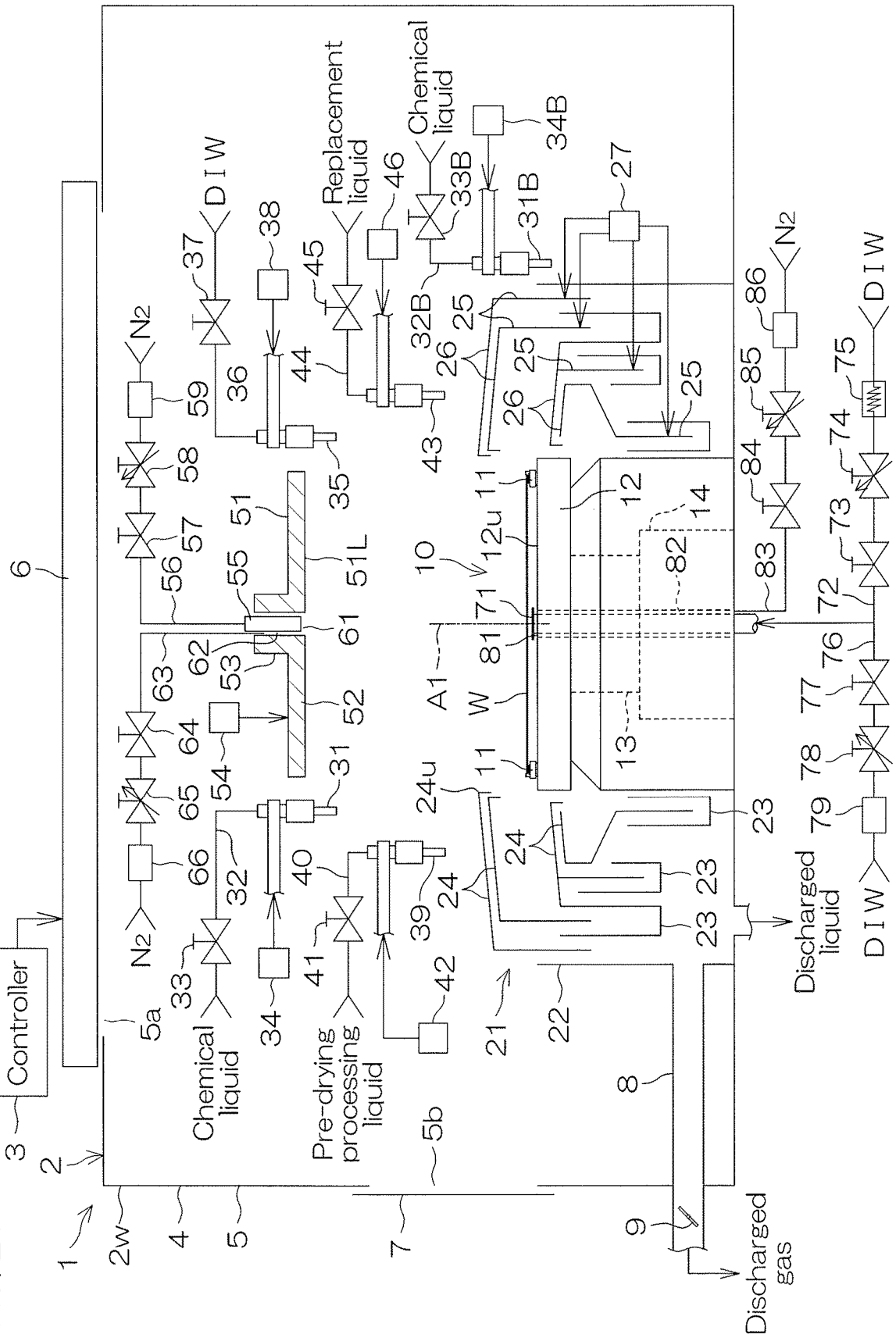
FIG. 21 is schematic view showing the inside of a processing unit, when viewed horizontally, which is provided in a substrate processing apparatus according to a second preferred embodiment.

FIG. 21 is a schematic view showing the inside of the processing unit 2 provided in the substrate processing apparatus 1 according to the second preferred embodiment, when viewed horizontally.

The plurality of nozzles in the processing unit 2 further include a second chemical liquid nozzle 31B that discharges, to the upper surface of the substrate W, a chemical liquid that is different from the chemical liquid discharged from the chemical liquid nozzle 31 corresponding to the first chemical liquid nozzle. The second chemical liquid nozzle 31B may be a scan nozzle that is horizontally movable within the chamber 4, or may also be a fixed nozzle that is secured to the partition wall 5 of the chamber 4. FIG. 21 shows an example in which the second chemical liquid nozzle 31B is a scan nozzle.

The second chemical liquid nozzle 31B is connected to a second chemical liquid piping 32B that guides the chemical liquid to the second chemical liquid nozzle 31B. When a second chemical liquid valve 33B interposed in the second chemical liquid piping 32B is opened, the chemical liquid is continuously discharged downwardly from the discharge port of the second chemical liquid nozzle 31B. As long as the chemical liquid discharged from the second chemical liquid nozzle 31B is different from the chemical liquid discharged from the chemical liquid nozzle 31, the chemical liquid discharged from the second chemical liquid nozzle 31B may be a liquid containing at least one of sulfuric acid, nitric acid, hydrochloric acid, hydrofluoric acid, phosphoric acid, acetic acid, ammonia water, a hydrogen peroxide solution, organic acid (e.g., such as citric acid or oxalic acid), organic alkaline (e.g., such as TMAH: tetramethyl ammonium hydroxide), a surface-active agent, and a corrosion inhibitor, or alternatively, may be a liquid other than that.

The second chemical liquid nozzle 31B is connected to a nozzle moving unit 34B that moves the second chemical liquid nozzle 31B at least in one of the vertical and horizontal directions. The nozzle moving unit 34B horizontally moves the second chemical liquid nozzle 31B between the processing position at which the chemical liquid discharged from the second chemical liquid nozzle 31B is supplied to the upper surface of the substrate W and the standby position at which the second chemical liquid nozzle 31B is located around the processing cup 21 in plan view.

As described above, the pre-drying processing liquid contains the adsorbent substance in addition to the sublimable substance and the solvent. The pre-drying processing liquid is a solution that contains the sublimable substance corresponding to a solute, the solvent that dissolves with the sublimable substance, and the adsorbent substance adsorbed to the surface of the pattern P1 (see FIG. 23A). The sublimable substance, the solvent, and the adsorbent substance are different in type from each other. The adsorbent substance is a substance that dissolves with at least one of the sublimable substance and the solvent.

The solvent is a liquid of dissolved substance that dissolves with the sublimable substance. The concentration of the dissolved substance in the pre-drying processing liquid is higher than the concentration of the sublimable substance in the pre-drying processing liquid and higher than the concentration of the adsorbent substance in the pre-drying processing liquid. The concentration of the adsorbent substance in the pre-drying processing liquid may be equal to the concentration of the sublimable substance in the pre-drying processing liquid, or may also be different from the concentration of the sublimable substance in the pre-drying processing liquid.

The adsorbent substance has amphiphilic molecules that contain both the hydrophilic group and the hydrophobic group. The adsorbent substance may be a surface-active agent. As long as the adsorbent substance is different from the sublimable substance and the solvent, the adsorbent substance may be a substance that changes from solid to gas without passing through to a liquid at normal temperature or at normal pressure (i.e., a substance having sublimability), or alternatively, may be a substance other than those. The sublimable substance may be a hydrophobic substance or a hydrophilic substance, or may also be an amphiphilic molecule. Likewise, the solvent may be a hydrophobic substance or a hydrophilic substance, or may also have amphiphilic molecules.

When the sublimable substance is a hydrophilic substance or has amphiphilic molecules, the adsorbent substance may be higher in hydrophilicity than the sublimable substance. In other words, the solubility of the adsorbent substance in water may be higher than the solubility of the sublimable substance in water. When the sublimable substance is a hydrophobic substance or has amphiphilic molecules, the sublimable substance may be higher in hydrophobicity than the adsorbent substance. In other words, the solubility of the sublimable substance in oil may be higher than the solubility of the adsorbent substance in oil. The same applies to the solvent.

When the surface of the pattern P1 is hydrophilic and the adsorbent substance is higher in hydrophilicity than the sublimable substance, the adsorbent substance is more easily adsorbed to the surface of the pattern P1 than the sublimable substance is. The hydrophilic group of the adsorbent substance is adhered to the surface of the pattern P1, while the sublimable substance is adhered to the hydrophobic group of the adsorbent substance adhered to the surface of the pattern P1. When the surface of the pattern P1 is hydrophobic, and the sublimable substance is higher in hydrophobicity than the adsorbent substance, the sublimable substance is more easily adsorbed to the surface of the pattern P1 than the adsorbent substance is. Therefore, whether the surface of the pattern P1 is either hydrophilic or hydrophobic, it is possible to locate the sublimable substance on the surface of the pattern P1 or in its vicinity.

The freezing point of the sublimable substance is higher than the room temperature. The freezing point of the sublimable substance may be higher than the boiling point of the solvent. The freezing point of the solvent is lower than the room temperature. The freezing point of the adsorbent substance may be the room temperature or may be different from the room temperature. When the freezing point of the adsorbent substance is higher than the room temperature, the freezing point of the adsorbent substance may be equal to the freezing point of the sublimable substance or may be different from the freezing point of the sublimable substance. The freezing point of the pre-drying processing liquid is lower than the room temperature (23° C. or a value in its vicinity). The freezing point of the pre-drying processing liquid may be equal to or greater than the room temperature.

The vapor pressure of the solvent is higher than that of the sublimable substance and higher than that of the adsorbent substance. The vapor pressure of the adsorbent substance may be equal to that of the sublimable substance or may be different from that of the sublimable substance. The solvent evaporates from the pre-drying processing liquid at an evaporation rate that is greater than the evaporation rates of the sublimable substance and the adsorbent substance. The freezing point of the pre-drying processing liquid rises as the solvent evaporates. When the freezing point of the pre-drying processing liquid rises to the room temperature, the pre-drying processing liquid changes from liquid to solid. This allows the solidified body 101 containing the sublimable substance to be formed.

Hereinafter, description will be made for an example in which the sublimable substance is camphor, the solvent is IPA, and the adsorbent substance is tertiary butyl alcohol. In the descriptions below, the pre-drying processing liquid is a solution of camphor, IPA, and tertiary butyl alcohol. In place of camphor, naphthalene may be contained in the pre-drying processing liquid. In place of IPA, acetone or PGEE may be contained in the pre-drying processing liquid. In place of tertiary butyl alcohol, cyclohexanol may be contained in the pre-drying processing liquid.

The molecule of camphor includes a hydrocarbon group, that is a hydrophobic group, and a carbonyl group that is a hydrophilic group. The molecule of IPA includes an alkyl group, that is a hydrophobic group, and a hydroxyl group that is a hydrophilic group. The molecule of tertiary butyl alcohol also includes an alkyl group, that is a hydrophobic group, and a hydroxyl group that is a hydrophilic group. The IPA and tertiary butyl alcohol are amphiphilic molecules. Strictly speaking, the camphor is amphiphilic molecule, but it is regarded as a hydrophobic substance because the camphor has a significantly lower solubility in water as compared with tertiarybutyl alcohol. The camphor is higher in hydrophobicity than tertiary butyl alcohol.

The first tank 87A and the second tank 87B shown in FIG. 3 store pre-drying processing liquids that are the same in the concentration of the adsorbent substance and different in the concentration of sublimable substance. Therefore, even when the pre-drying processing liquid supplied from the first tank 87A is mixed with the pre-drying processing liquid supplied from the second tank 87B, the resulting concentration of the adsorbent substance in the mixed pre-drying processing liquid is unchanged from the concentration of the adsorbent substance in the pre-drying processing liquid inside the first tank 87A and the second tank 87B. The initial concentration of the sublimable substance in the pre-drying processing liquid inside the first tank 87A and the second tank 87B may be set to the same value as that of the first preferred embodiment or may be set to a value different from the value of the first preferred embodiment.

Next, description will be made below for an example of processing the substrate W according to the second preferred embodiment.

Figure 22:
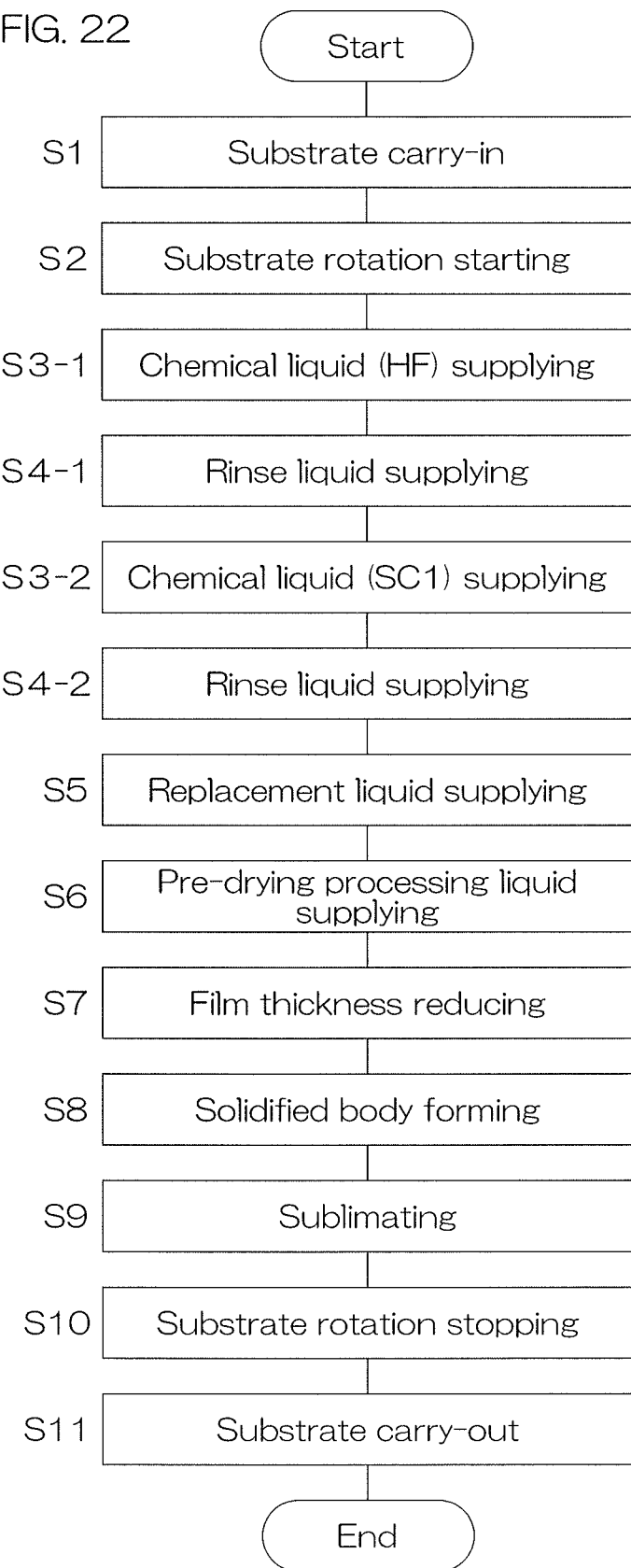
FIG. 22 is a process chart for describing an example of substrate processing according to the second preferred embodiment.

FIG. 22 is a process chart for describing an example of processing the substrate W according to the second preferred embodiment. In the descriptions below, FIG. 21 and FIG. 22 will be referred to.

In the example of processing the substrate W according to the second preferred embodiment, in place of step S3 to step S4 shown in FIG. 5, step S3-1 to step S4-2 shown in FIG. 22 are performed. The steps other than those are the same as step S1 to step S2 and step S5 to step S11 shown in FIG. 5. Therefore, description will be made below for step S3-1 to step S4-2.

Additionally, description will be made below for an example in which hydrofluoric acid and SC1 (a liquid mixture of ammonia, hydrogen peroxide, and water) are sequentially supplied to a silicon wafer corresponding to the substrate W. The hydrofluoric acid is supplied to the silicon wafer to thereby remove, from the silicon wafer, a natural oxidation film formed on the silicon wafer. This allows the silicon to be exposed on the surface of the pattern P1. Thereafter, SC1 is supplied to the silicon wafer. The silicon exposed on the surface of the pattern P1 is changed to silicon oxide when brought into contact with SC1. This causes the surface of the pattern P1 to change from hydrophobic to hydrophilic. Therefore, the pre-drying processing liquid is supplied to the silicon wafer when the surface of the pattern P1 is hydrophilic.

As shown in FIG. 22, after the substrate W has started to rotate (step S2 in FIG. 22), a first chemical liquid supplying step (step S3-1 in FIG. 22) is performed to supply hydrofluoric acid serving as an example of chemical liquid to the upper surface of the substrate W and thereby form a liquid film of hydrofluoric acid covering the entire upper surface of the substrate W.

Specifically, with the shielding member 51 located at the upper position and at least one guard 24 located at the upper position, the nozzle moving unit 34 moves the chemical liquid nozzle 31 from the standby position to the processing position. Thereafter, the chemical liquid valve 33 is opened, so that the chemical liquid nozzle 31 starts to discharge the hydrofluoric acid. When a predetermined time has elapsed after the chemical liquid valve 33 was opened, the chemical liquid valve 33 is closed to thereby stop discharging the hydrofluoric acid. Thereafter, the nozzle moving unit 34 moves the chemical liquid nozzle 31 to the standby position.

The hydrofluoric acid discharged from the chemical liquid nozzle 31 collides with the upper surface of the substrate W that is rotating at the liquid supplying speed and then, flows outwardly along the upper surface of the substrate W due to centrifugal force. Thus, the hydrofluoric acid is supplied to the entire upper surface of the substrate W to thereby form the liquid film of hydrofluoric acid covering the entire upper surface of the substrate W. While the chemical liquid nozzle 31 is discharging the hydrofluoric acid, the nozzle moving unit 34 may move a liquid landing position so that the liquid landing position of the hydrofluoric acid passes the center portion and the outer circumference portion of the upper surface of the substrate W or alternatively, may bring the liquid landing position to a standstill at the center portion.

Next, a first rinse liquid supplying step (step S4-1 in FIG. 22) is performed to supply pure water serving as an example of rinse liquid to the upper surface of the substrate W and thereby wash away the hydrofluoric acid on the substrate W.

Specifically, with the shielding member 51 located at the upper position and at least one guard 24 located at the upper position, the nozzle moving unit 38 moves the rinse liquid nozzle 35 from the standby position to the processing position. Thereafter, the rinse liquid valve 37 is opened, so that the rinse liquid nozzle 35 starts to discharge a rinse liquid. Before pure water starts to be discharged, the guard elevating/lowering unit 27 may vertically move at least one guard 24 in order to switch the guard 24 that receives the liquid discharged from the substrate W. When a predetermined time has elapsed after the rinse liquid valve 37 is opened, the rinse liquid valve 37 is closed to thereby stop discharging the rinse liquid. Thereafter, the nozzle moving unit 38 moves the rinse liquid nozzle 35 to the standby position.

The pure water discharged from the rinse liquid nozzle 35 collides with the upper surface of the substrate W that is rotating at the liquid supplying speed, and then, flows outwardly along the upper surface of the substrate W due to centrifugal force. The hydrofluoric acid on the substrate W is replaced with the pure water discharged from the rinse liquid nozzle 35. This causes a liquid film of pure water covering the entire upper surface of the substrate W to be formed. While the rinse liquid nozzle 35 is discharging pure water, the nozzle moving unit 38 may move a liquid landing position so that the liquid landing position of the pure water passes the center portion and the outer circumference portion of the upper surface of the substrate W, or alternatively, may bring the liquid landing position to a standstill at the center portion.

Next, a second chemical liquid supplying step (step S3-2 in FIG. 22) is performed to supply SC1 serving as an example of chemical liquid to the upper surface of the substrate W to thereby form a liquid film of SC1 covering the entire upper surface of the substrate W.

Specifically, with the shielding member 51 located at the upper position and at least one guard 24 located at the upper position, the nozzle moving unit 34B moves the second chemical liquid nozzle 31B from the standby position to the processing position. Thereafter, the second chemical liquid valve 33B is opened, so that the second chemical liquid nozzle 31B starts to discharge SC1. When a predetermined time has elapsed after the second chemical liquid valve 33B is opened, the second chemical liquid valve 33B is closed to thereby stop discharging the SC1. Thereafter, the nozzle moving unit 34B moves the second chemical liquid nozzle 31B to the standby position.

The SC1 discharged from the second chemical liquid nozzle 31B collides with the upper surface of the substrate W that is rotating at the liquid supplying speed, and then, flows outwardly along the upper surface of the substrate W due to centrifugal force. The pure water on the substrate W is replaced with the SC1 discharged from the second chemical liquid nozzle 31B. This causes a liquid film of SC1 covering the entire upper surface of the substrate W to be formed. While the second chemical liquid nozzle 31B is discharging SC1, the nozzle moving unit 34B may move a liquid landing position so that the liquid landing position of the SC1 passes the center portion and the outer circumference portion of the upper surface of the substrate W, or alternatively, may bring the liquid landing position to a standstill at the center portion.

Next, a second rinse liquid supplying step (step S4-2 in FIG. 22) is performed to supply pure water serving as an example of rinse liquid to the upper surface of the substrate W and thereby wash away the SC1 on the substrate W.

Specifically, with the shielding member 51 located at the upper position and at least one guard 24 located at the upper position, the nozzle moving unit 38 moves the rinse liquid nozzle 35 from the standby position to the processing position. Thereafter, the rinse liquid valve 37 is opened, so that the rinse liquid nozzle 35 starts to discharge the rinse liquid. Before the pure water starts to be discharged, the guard elevating/lowering unit 27 may vertically move at least one guard 24 in order to switch the guard 24 that receives the liquid discharged from the substrate W. When a predetermined time has elapsed after the rinse liquid valve 37 was opened, the rinse liquid valve 37 is closed to thereby stop discharging the rinse liquid. Thereafter, the nozzle moving unit 38 moves the rinse liquid nozzle 35 to the standby position.

The pure water discharged from the rinse liquid nozzle 35 collides with the upper surface of the substrate W that is rotating at the liquid supplying speed, and then, flows outwardly along the upper surface of the substrate W due to centrifugal force. The SC1 on the substrate W is replaced with the pure water discharged from the rinse liquid nozzle 35. This causes a liquid film of pure water covering the entire upper surface of the substrate W to be formed. While the rinse liquid nozzle 35 is discharging the pure water, the nozzle moving unit 38 may move a liquid landing position so that the liquid landing position of the pure water passes the center portion and the outer circumference portion of the upper surface of the substrate W, or alternatively, may bring the liquid landing position to a standstill at the center portion.

In a similar manner as the example of processing the substrate W according to the first preferred embodiment shown in FIG. 5, after the second rinse liquid supplying step (step S4-2 in FIG. 22) is performed, the replacement liquid and the pre-drying processing liquid are sequentially supplied to the substrate W (step S5 to step S6 in FIG. 22) to sublimate the solidified body 101 (see FIG. 23E) on the front surface of the substrate W (step S7 to step S9 in FIG. 22). Thereafter, the substrate W is carried out of the chamber 4 (step S10 to step S11 in FIG. 22). Thus, the processed substrate W is carried out of the chamber 4.

Next, description will be made for a possible phenomenon that may occur on the surface of the pattern P1 to which the pre-drying processing liquid is supplied.

Figure 23A:
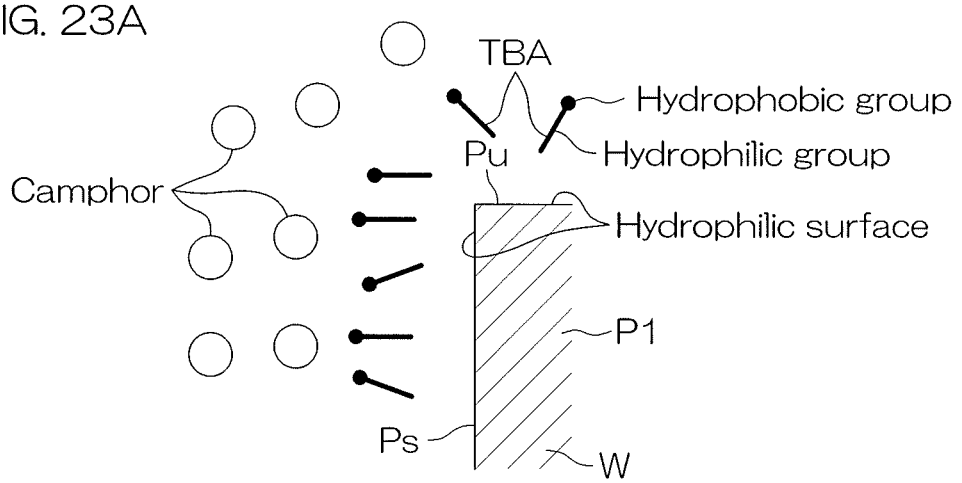
FIG. 23A is a cross-sectional view of a substrate for describing a phenomenon that is expected to occur on the surface of the pattern to which the pre-drying processing liquid has been supplied.
Figure 23B:
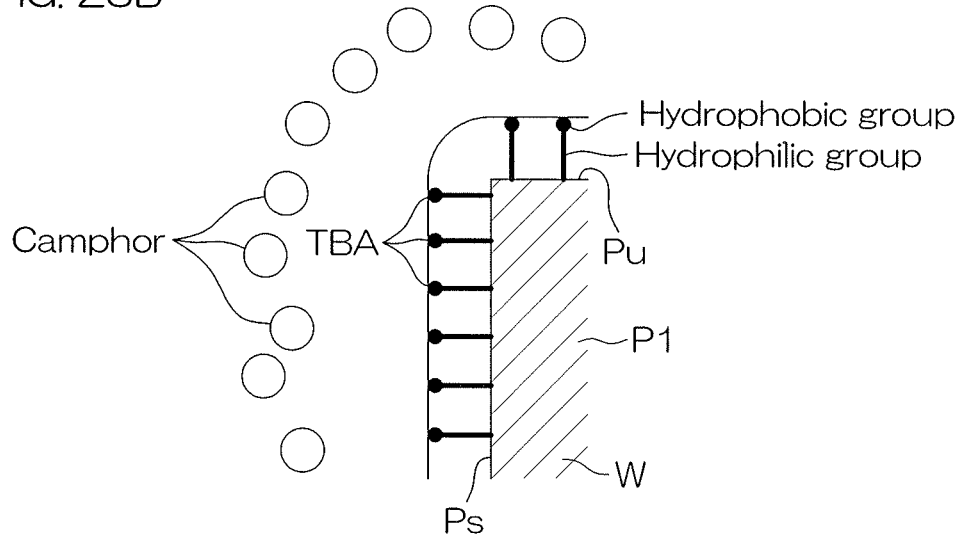
FIG. 23B is a cross-sectional view of the substrate for describing the same phenomenon.
Figure 23C:
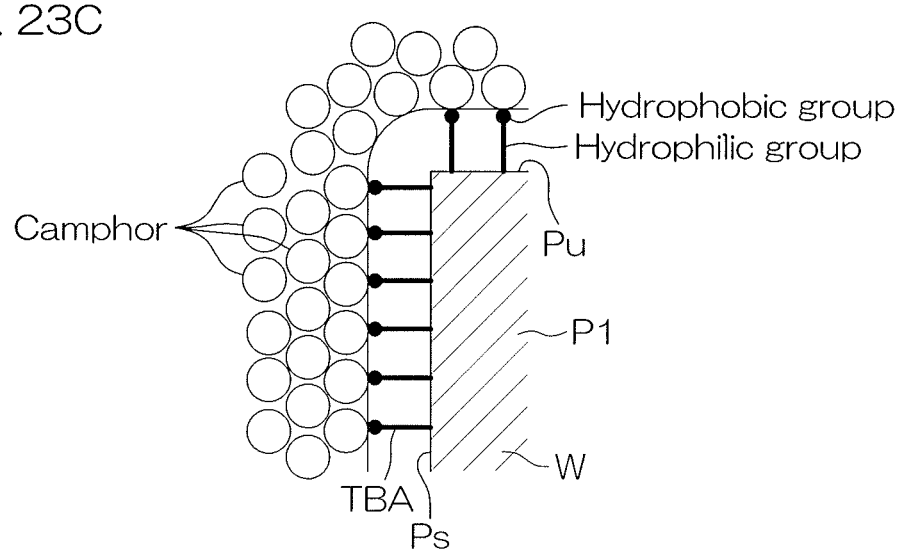
FIG. 23C is a cross-sectional view of the substrate for describing the same phenomenon.

FIG. 23A to FIG. 23F are a cross-sectional view of the substrate W for describing the phenomenon. FIG. 23A to FIG. 23E show tertiary butyl alcohol as TBA. FIG. 23A to FIG. 23C show the hydrophilic group of the tertiary butyl alcohol molecule in a bold straight line and the hydrophobic group of the tertiary butyl alcohol molecule is shown by a black circle.

As described above, in the example of processing the substrate W according to the second preferred embodiment, hydrofluoric acid and SC1 are sequentially supplied to a silicon wafer corresponding to the substrate W. The surface of the pattern P1 changes to hydrophobic by supplying the hydrofluoric acid. Thereafter, the surface of the pattern P1 changes to hydrophilic by supplying the SC1. Therefore, the pre-drying processing liquid containing camphor, IPA, and tertiary butyl alcohol is supplied to the silicon wafer when the surface of the pattern P1 is hydrophilic.

The camphor can be regarded as hydrophobic, and the tertiary butyl alcohol has amphiphilic molecules that contain both the hydrophilic group and the hydrophobic group. As shown in FIG. 23A, since the surface of the pattern P1 is hydrophilic, the hydrophilic group of the tertiary butyl alcohol molecule is attracted to the surface of the pattern P1. As shown in FIG. 23B, this allows the hydrophilic group of the tertiary butyl alcohol molecule to be adsorbed to the surface of the pattern P1. Thus, a thin film of tertiary butyl alcohol is formed on a side surface Ps and an upper surface Pu of the pattern P1.

FIG. 23B shows an example in which a monomolecular film of tertiary butyl alcohol is formed across the surface of the pattern P1. As shown in FIG. 23C, in the case of the example, the hydrophobic group of the camphor molecule is adhered to the hydrophobic group of the tertiary butyl alcohol molecule adsorbed to the surface of the pattern P1. When a stacked film of tertiary butyl alcohol is formed across the surface of the pattern P1, the hydrophobic group of the camphor molecule is adhered to the hydrophobic group of the tertiary butyl alcohol molecule exposed on the surface layer of the stacked film. This allows the camphor to be held on the surface of the pattern P1 through the thin film of tertiary butyl alcohol.

Figure 23D:
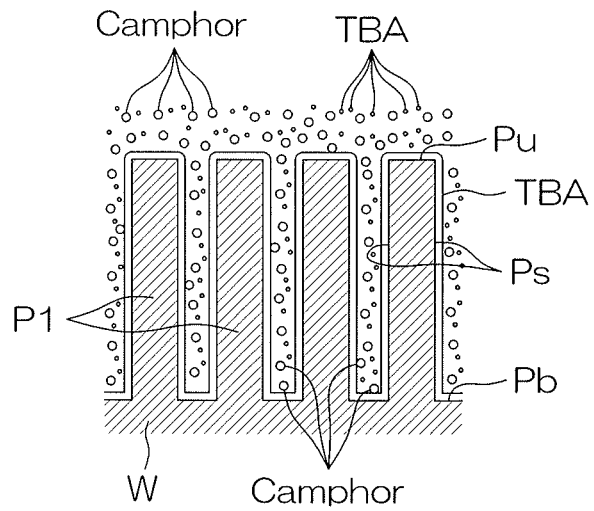
FIG. 23D is a cross-sectional view of the substrate for describing the same phenomenon.

As shown in FIG. 23C, the camphor molecule in the pre-drying processing liquid is adhered to the camphor molecule held on the thin film of tertiary butyl alcohol. The phenomenon causes a large number of camphor molecules to be held on the side surface Ps of the pattern P1 through the molecular layer of tertiary butyl alcohol. Thus, as shown in FIG. 23D, a sufficient amount of camphor molecules enter in between patterns P1. FIG. 23D shows an example in which the thin film of tertiary butyl alcohol is formed not only on the side surface Ps and the upper surface Pu of the pattern P1 but also on a bottom surface Pb of a recessed portion formed between two adjacent patterns P1.

Figure 23E:
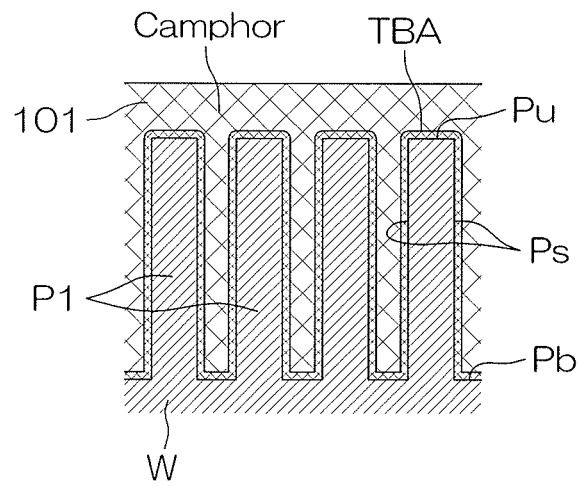
FIG. 23E is a cross-sectional view of the substrate for describing the same phenomenon.
Figure 23F:
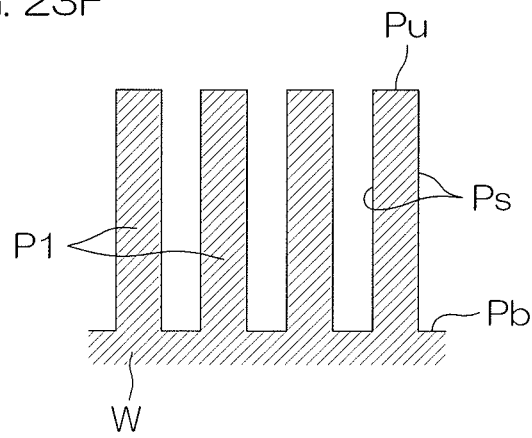
FIG. 23F is a cross-sectional view of the substrate for describing the same phenomenon.

The IPA corresponding to the solvent evaporates from the pre-drying processing liquid with the thin film of tertiary butyl alcohol formed along the surface of the pattern P1 and a plurality of camphor molecules held on the surface of the pattern P1 through the thin film of tertiary butyl alcohol. As the IPA evaporates, the freezing point of the pre-drying processing liquid rises, and the concentrations of the camphor and the tertiary butyl alcohol increase. As shown in FIG. 23E, this causes the solidified body 101 containing the camphor and the tertiary butyl alcohol to be formed on the front surface of the substrate W. Thereafter, as shown in FIG. 23F, the solidified body 101 is vaporized to be thereby removed from the front surface of the substrate W.

According to the studies by the present inventors, it was confirmed that the collapse rate of the pattern P1 has been lowered as compared with using a solution of camphor and IPA as the pre-drying processing liquid when the processing the substrate W according to the second preferred embodiment is performed using a plate-shaped silicon sample, on which the pattern P1 has been formed, in place of the substrate W, and using a solution of camphor, IPA, and tertiary butyl alcohol as the pre-drying processing liquid. When the concentration of tertiary butyl alcohol (volume percent concentration) was changed within the range from 0.1 vol % to 10 vol %, no significant difference was found among the collapse rates of the pattern P1. Therefore, adding even a small amount of tertiary butyl alcohol will lower the collapse rate of the pattern P1. The concentration of tertiary butyl alcohol may have a value within the range or may also be a value outside the range.

In addition to the effects according to the first preferred embodiment, the second preferred embodiment can obtain the following effects. Specifically, in the second preferred embodiment, the pre-drying processing liquid containing the adsorbent substance is supplied to the front surface of the substrate W, on which the pattern P1 has been formed, in addition to the sublimable substance and the solvent. Thereafter, the solvent is evaporated from the pre-drying processing liquid. This allows the solidified body 101 containing the sublimable substance to be formed on the front surface of the substrate W. Thereafter, the solidified body 101 on the substrate W is changed to gas without passing through to a liquid. This causes the solidified body 101 to be removed from the front surface of the substrate W. Therefore, the collapse rate of the pattern P1 can be lowered as compared with the conventional drying method such as the spin dry.

The sublimable substance is a substance that contains the hydrophobic group in the molecule. The adsorbent substance is a substance that contains the hydrophobic group and the hydrophilic group in the molecule. The adsorbent substance is higher in hydrophilicity than the sublimable substance. Whether the surface of the pattern P1 is hydrophilic or hydrophobic, or alternatively even when the surface of the pattern P1 includes a hydrophilic portion and a hydrophobic portion, the adsorbent substance in the pre-drying processing liquid is adsorbed to the surface of the pattern P1.

Specifically, when the surface of the pattern P1 is hydrophilic, the hydrophilic group of the adsorbent substance in the pre-drying processing liquid is adhered to the surface of the pattern P1, and the hydrophobic group of the sublimable substance in the pre-drying processing liquid is adhered to the hydrophobic group of the adsorbent substance. This allows the sublimable substance to be held on the surface of the pattern P1 through the adsorbent substance. When the surface of the pattern P1 is hydrophobic, at least the hydrophobic group of the sublimable substance is adhered to the surface of the pattern P1. Therefore, whether the surface of the pattern P1 is hydrophilic or hydrophobic, or alternatively even when the surface of the pattern P1 includes a hydrophilic portion and a hydrophobic portion, the sublimable substance is held on the surface of the pattern P1 or in its vicinity before the solvent is evaporated.

When the sublimable substance is hydrophilic, and the surface of the pattern P1 is hydrophilic, the sublimable substance is attracted to the surface of the pattern P1 due to electrical attractive force. Meanwhile, when the sublimable substance is hydrophobic, and the surface of the pattern P1 is hydrophilic, such attractive force is weak or never occurs, and thus the sublimable substance is unlikely to adhere to the surface of the pattern P1. Furthermore, when the sublimable substance is hydrophobic, and the patterns P1 have very narrow spacings in addition to the surface of the pattern P1 being hydrophilic, it is thought that a sufficient amount of sublimable substance may not enter between the patterns P1. These phenomena also occur when the sublimable substance is hydrophilic, and the surface of the pattern P1 is hydrophobic.

When the solvent is evaporated while the sublimable substance is not found on the surface of the pattern P1 or in its vicinity, the solvent in contact with the surface of the pattern P1 may apply a collapsing force to the pattern P1, causing the pattern P1 to be collapsed. When the solvent is evaporated while a sufficient amount of sublimable substance is not found between the patterns P1, it is also thought that spacings between the patterns P1 may not be filled with the solidified body 101, thus causing the pattern P1 to be collapsed. If the sublimable substance is disposed on the surface of the pattern P1 or in its vicinity before the solvent is evaporated, such collapse can be reduced. This makes it possible to lower the collapse rate of the pattern P1.

In the second preferred embodiment, not only the sublimable substance but also the adsorbent substance has sublimability. The adsorbent substance changes from solid to gas without passing through to a liquid at normal temperature or at normal pressure. When at least a portion of the surface of the pattern P1 is hydrophilic, the solvent evaporates with the adsorbent substance in the pre-drying processing liquid adsorbed to the surface of the pattern P1. The adsorbent substance changes from liquid to solid on the surface of the pattern P1. This allows the solidified body 101 containing the adsorbent substance and the sublimable substance to be formed. Thereafter, the solid of the adsorbent substance changes to gas without passing through to a liquid on the surface of the pattern P1. Therefore, the collapsing force can be lowered as compared with the case where the liquid is vaporized on the surface of the pattern P1.

In the second preferred embodiment, the pre-drying processing liquid having the adsorbent substance of a lower concentration is supplied to the front surface of the substrate W. When at least a portion of the surface of the pattern P1 is hydrophilic, the hydrophilic group of the adsorbent substance is adhered to the surface of the pattern P1, so that the monomolecular film of the adsorbent substance is formed along the surface of the pattern P1. At a high concentration of the adsorbent substance, a plurality of monomolecular films are stacked in layers, so that the stacked film of the adsorbent substance is formed along the surface of the pattern P1. In the case, the sublimable substance is held on the surface of the pattern P1 through the stacked film of the adsorbent substance. A thick stacked film of the adsorbent substance causes the sublimable substance entering between patterns P1 to be reduced. Therefore, by lowering the concentration of the adsorbent substance, a greater amount of the sublimable substance can enter between the patterns P1.

In the second preferred embodiment, the pre-drying processing liquid containing the sublimable substance that is higher in hydrophobicity than the adsorbent substance is supplied to the front surface of the substrate W. Since any of the sublimable substance and the adsorbent substance contains the hydrophobic group, when at least a portion of the surface of the pattern P1 is hydrophobic, both the sublimable substance and the adsorbent substance can be adhered to the surface of the pattern P1. However, since the affinity between the sublimable substance and the pattern P1 is higher than the affinity between the adsorbent substance and the pattern P1, a greater amount of the sublimable substance as compared with the adsorbent substance is adhered to the surface of the pattern P1. This allows more sublimable substance to be adhered to the surface of the pattern P1.

Other Preferred Embodiments

The present invention is not restricted to the contents of the above described preferred embodiments and various modifications are possible.

For example, to change the thickness T1 of the solidified body 101, a condition other than the concentration of the pre-drying processing liquid may be changed. For example, in addition to or in place of the concentration of the pre-drying processing liquid, the temperature of the pre-drying processing liquid may be changed.

The pattern P1 is not limited to a single-layer structure, but may have a layered structure. At least a portion of the pattern P1 may be formed of a material other than silicon. For example, at least a portion of the pattern P1 may be formed of metal.

In an example of processing the substrate W according to First and the second preferred embodiments, to maintain the pre-drying processing liquid on the substrate W in a liquid state, a temperature holding step may be performed to maintain the pre-drying processing liquid on the substrate W at a liquid holding temperature that is higher than the freezing point of the pre-drying processing liquid and lower than the boiling point of the pre-drying processing liquid.

When the rinse liquid such as pure water on the substrate W can be replaced with the pre-drying processing liquid, the pre-drying processing liquid supplying step may be performed without performing the replacement liquid supplying step to replace the rinse liquid on the substrate W with the replacement liquid.

In an example of processing the substrate W according to the second preferred embodiment, the surface of the pattern P1 may be hydrophilic from the beginning, that is, before being carried into the substrate processing apparatus 1. In the case, the second chemical liquid supplying step (step S3-2 in FIG. 22) and the second rinse liquid supplying step (step S4-2 in FIG. 22) may be eliminated. Furthermore, the chemical liquid supplied to the substrate W in the first chemical liquid supplying step (step S3-1 in FIG. 22) may be a chemical liquid other than hydrofluoric acid.

In an example of processing the substrate W according to the second preferred embodiment, when the pre-drying processing liquid is supplied to the front surface of the substrate W, the surface of the pattern P1 may be hydrophobic. In the case, the surface of the pattern P1 may be hydrophobic from the beginning or may be changed to hydrophobic while the substrate W is being processed.

In the second preferred embodiment, if the initial concentration of the sublimable substance (the concentration of the sublimable substance in the pre-drying processing liquid before being supplied to the substrate W) is not changed, one of the first tank 87A and the second tank 87B shown in FIG. 3 may be eliminated.

In the second preferred embodiment, the adsorbent substance may be mixed with a solution of the sublimable substance and the solvent at a position outside the first tank 87A and the second tank 87B. In the case, the adsorbent substance may be mixed before the solution of the sublimable substance and the solvent is discharged from the pre-drying processing liquid nozzle 39, or may be mixed after the solution of the sublimable substance and the solvent is discharged from the pre-drying processing liquid nozzle 39. In the latter case, the adsorbent substance may be mixed with the solution of the sublimable substance and the solvent in a space between the pre-drying processing liquid nozzle 39 and the substrate W, or may be mixed with the solution of the sublimable substance and the solvent on the upper surface of the substrate W.

The shielding member 51 may include a cylindrical portion that extends downwardly from the outer circumferential portion of the disc portion 52 in addition to the disc portion 52. In the case, when the shielding member 51 is disposed at the lower position, the substrate W held on the spin chuck 10 is surrounded by the cylindrical portion.

The shielding member 51 may rotate around the rotation axis A1 together with the spin chuck 10. For example, the shielding member 51 may be placed on the spin base 12 so as not to contact the substrate W. In the case, since the shielding member 51 is coupled to the spin base 12, the shielding member 51 rotates at the same speed in the same direction as that of the spin base 12.

The shielding member 51 may be eliminated. However, when a liquid such as pure water is supplied to the lower surface of the substrate W, the shielding member 51 is preferably provided. This is because the shielding member 5l can interrupt droplets that run across the outer circumferential surface of the substrate W to go around from the lower surface of the substrate W to the upper surface of the substrate W or those droplets that bounce inwardly from the processing cup 21, thus reducing a liquid that would be otherwise mixed into the pre-drying processing liquid on the substrate W.

The substrate processing apparatus 1 is not restricted to an apparatus for processing a disc-shaped substrate W, and may be an apparatus for processing a polygonal substrate W.

The substrate processing apparatus 1 is not restricted to a single substrate processing type apparatus, and may be a batch type apparatus that processes a plurality of substrates in a batch.

Two or more arrangements among all the arrangements described above may be combined. Two or more steps among all the steps described above may be combined.

The pre-drying processing liquid nozzle 39 is an example of the pre-drying processing liquid supplying unit. The central nozzle 55 and the spin motor 14 are an example of a solidified body forming unit. The central nozzle 55 and the spin motor 14 are an example of a sublimating unit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A substrate processing method comprising:
   a pre-drying processing liquid supplying step of supplying a front surface of a substrate, on which a pattern has been formed, with a pre-drying processing liquid containing a sublimable substance that changes to gas without passing through to a liquid and a solvent in which the sublimable substance dissolves;

a solidified body forming step of forming a solidified body containing the sublimable substance on the front surface of the substrate by evaporating the solvent from the pre-drying processing liquid on the front surface of the substrate; and a sublimating step of removing the solidified body from the front surface of the substrate by sublimating the solidified body, wherein a value acquired by multiplying a ratio of a thickness of the solidified body to a height of the pattern by 100 is greater than 76 and less than 219, wherein the pre-drying processing liquid supplied to the front surface of the substrate in the pre-drying processing liquid supplying step is a solution that contains the sublimable substance containing a hydrophobic group, the solvent, and an adsorbent substance that contains a hydrophobic group and a hydrophilic group and is higher in hydrophilicity than the sublimable substance.

2. The substrate processing method according to claim 1, wherein
the adsorbent substance is a substance having sublimability.

3. The substrate processing method according to claim 1, wherein a concentration of the adsorbent substance in the pre-drying processing liquid is lower than the concentration of the solvent in the pre-drying processing liquid.

4. The substrate processing method according to claim 1, wherein
the sublimable substance is higher in hydrophobicity than the adsorbent substance.

* * * * *